United States Patent

Foerster

[15] 3,644,923

[45] Feb. 22, 1972

[54] THRESHOLD AND MAJORITY GATE ELEMENTS AND LOGICAL ARRANGEMENTS THEREOF

[72] Inventor: Roy P. Foerster, Thousands Oaks, Calif.

[73] Assignee: The Bunker-Ramo Corporation, Stamford, Conn.

[22] Filed: Jan. 22, 1970

[21] Appl. No.: 10,682

Related U.S. Application Data

[62] Division of Ser. No. 574,790, Aug. 24, 1966, Pat. No. 3,522,445.

[52] U.S. Cl. ........................................340/347 AD, 307/211

[51] Int. Cl. ........................................................H03k 13/00

[58] Field of Search ............340/347 AD, 347 DD; 235/154, 235/173; 307/211; 328/150, 158, 159

[56] References Cited

UNITED STATES PATENTS

| | | | |
|---|---|---|---|
| 3,100,298 | 8/1963 | Fluhr | 340/347 |
| 3,409,881 | 11/1968 | Marcus et al. | 307/211 X |
| 3,487,316 | 12/1969 | Winder | 307/211 X |

*Primary Examiner*—Thomas A. Robinson
*Attorney*—Frederick M. Arbuckle

[57] ABSTRACT

This invention relates to threshold and majority logic elements and threshold logic systems, and more particularly to improved threshold and majority gate circuit elements providing high "fan-in" and "fan-out" capabilities that permit the practical realization of threshold logic systems.

10 Claims, 14 Drawing Figures

INVENTOR
ROY P. FOERSTER

Patented Feb. 22, 1972 3,644,923

6 Sheets-Sheet 1

INVENTOR
ROY P. FOERSTER

INVENTOR
ROY P. FOERSTER

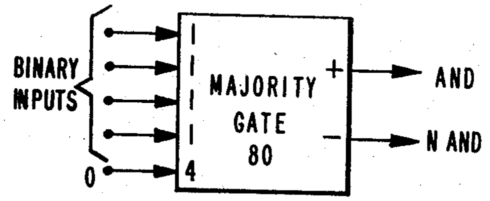
FIG.-5
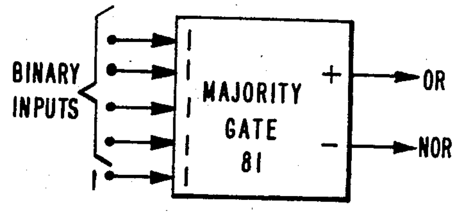
FIG.-6
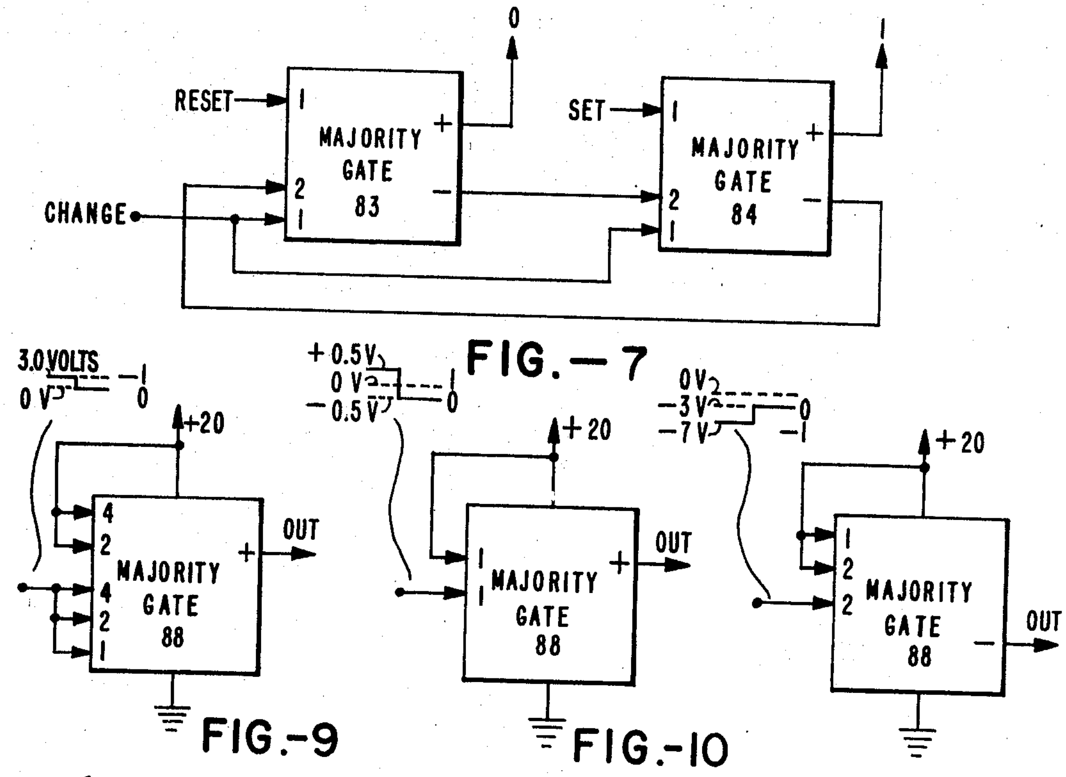
FIG.-7 FIG.-9 FIG.-10
FIG.-11
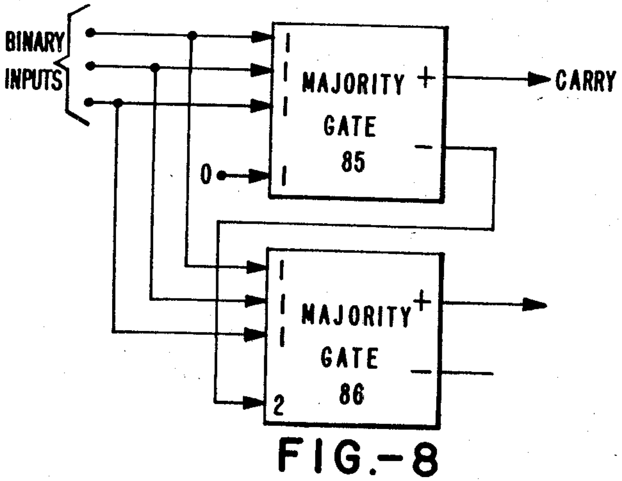
FIG.-8
INVENTOR
ROY P. FOERSTER

INVENTOR
ROY P. FOERSTER

INVENTOR
ROY P. FOERSTER

INVENTOR
ROY P. FOERSTER

THRESHOLD AND MAJORITY GATE ELEMENTS AND LOGICAL ARRANGEMENTS THEREOF

This application is a division of U.S. Pat. application Ser. No. 574,790, filed Aug. 24, 1966, now U.S. Pat. No. 3,522,445, which issued Aug. 4, 1970.

Certain complex logic functions that either cannot be performed by conventional digital logic techniques or that require a complex series of digital operations can, at least theoretically, be performed rather easily using threshold logic. Although the potential advantages of threshold logic in computer technology have long been recognized, there has been little practical application of previous theoretical work. Certain problems inherent in threshold logic have severely limited basic problem solving capabilities which are essential to the realization of practical threshold logic systems. As a result, such systems have, for the most part, remained nothing more than laboratory curiosities.

Threshold logic circuits may accurately be termed "quasidigital,"c since the logical decision outputs generated are generally two-level signals, as in conventional digital logic circuits, but the logical decisions that determine the output are made through an analog summation of weighted inputs, generally in a resistive Kirchoff-type adder circuit. One of the primary advantages of conventional binary logic is the tolerance of individual binary logic elements to wide variations in signal levels and circuit component values. In contrast, the analog nature of threshold gate elements makes them extremely sensitive to both signal level and component value variations. The magnitude of such variations and the tolerance of individual logic elements to these variations determine the "fan-in" and "fan-out" capabilities, as hereinafter defined, of these elements. Unless the fan-in and fan-out capabilities of individual elements are relatively high, practical threshold logic systems are not feasible.

In this regard, certain basic definitions concerning threshold logic systems should be understood. To begin with, a threshold logic element or gate may be defined as a logical circuit element which provides a first output signal level when the sum of a plurality of weighted inputs is equal to or greater than a preselected threshold level and which provides a different distinct output signal level when this sum is less than the threshold. A majority logic element or gate is simply a particular type of threshold gate which generates the first output signal level when the sum of all the weighted inputs of one polarity is equal to or greater then the sum of all the zero or opposite polarity valued inputs, and which provides the second different output signal level when the former sum is less than the latter. The "fan-in" capability of any such logic element is equal to the maximum value of the sum of the weighted inputs which an element can accept while resolving a single input of the smallest weight. The "fan-out" capability, on the other hand, is the maximum value of the sum of the weighted outputs from the element which can be provided without exceeding the design limit of its output circuitry; or, stated in other words, it is the maximum value of the sum of the weights of all the inputs to which the output signal of the element may be connected without causing a substantial variation in the magnitude of its output signal levels.

Probably the single most critical aspect of threshold gate elements lies in achieving an accurate analog summation of the weighted inputs and precise control of the threshold at the predetermined level, since any uncertainty in the result requires that a corresponding allowance be made in the threshold comparison to avoid logical errors. Such allowances necessarily reduce the usable summation signal and the available fan-in capability. Each factor causing an uncertainty in the accuracy of the input summation result, or in the maintenance of the proper threshold level, contributes to a cumulative reduction in fan-in capability.

In particular, the input summation network, more then any other single part of the circuit used in threshold gate elements, determines its fan-in capability. If the relative resistance values used in the summation network are not accurately proportioned, then the inputs are not properly weighted and accurate summation is impossible. To provide a practical fan-in capability usable in sophisticated threshold logic systems, resistors having no more than a 1-percent variation from rated values are necessary, taking into account both temperature and voltage coefficients and the effects of self-heating. Until recently, the lack of such precision resistors has been the most important factor preventing practical application of threshold logic. Available resistors having resistance values within 5 percent of the nominal rated values limited available fan-in capability to about nine, while more costly 3percent resistors raised it only to about 15, such fan-in values being entirely too low for sophisticated logic systems.

Similarly, achieving proper input summation also requires carefully regulated input voltage levels, and an accurate comparison of the summation result necessitates precise control of selected threshold levels. Previously, the narrow tolerance of the threshold elements to input and threshold variations would have required incorporation of precision regulated power supplies and specially designed ground planes and connections to minimize ground noise. Although it might also be possible to condition each input signal through the use of special voltage regulating circuitry, overall circuit complexity would be greatly increased.

As a general principle, complex threshold logic systems require that individual elements possess fan-out capabilities of the same order of magnitude as their fan-in capabilities. The output must be capable of driving a number of heavily weighted inputs to other threshold gate elements without having the output voltage level substantially affected by the size of the load. Obviously, variations in the output voltage level from one element would cause errors in the summation results in succeeding elements to which the output is connected as one of the inputs, and, conversely, variations in the input level might feed back through the outputs of preceding gate elements. To prevent this, the output from a practical threshold gate element should ideally approximate a low-impedance voltage source.

Heretofore, practical threshold logic systems, which would require fan-in and fan-out capabilities of 20 or more, have been considered impractical because of the difficulty and expense involved in producing individual threshold logic elements meeting such strict circuitry requirements. However, for most system applications, fan-in capabilities of between 40 and 100 are necessary before any practical advantage over conventional digital logic systems can be realized. Generally, individual threshold logic elements have slower speeds and consume more power than individual conventional digital logic elements. However, if relatively high fan-in and fan-out capabilities can be achieved so that each threshold logic element is able to solve a sufficiently high number of Boolean functions, the threshold logic system can perform in one operation certain functions that would normally require several sequential operations in conventional digital systems. Thus, a threshold logic system might approach or even surpass the speed of digital systems in certain applications and actually permit a power saving.

Therefore, it is an object of the present invention to provide improved threshold gate elements having relatively high fan-in and fan-out capabilities permitting their use in a practical threshold logic system.

Another object of the present invention is to provide improved threshold and majority gate logic elements having improved input summation networks for accurately resolving a relatively high number of weighted inputs.

A further object of the present invention is to provide improved threshold and majority gate logic elements with high fan-in and fan-out capabilities and providing reliable operation with substantial variations in temperature and voltage levels.

An additional object of the present invention is to provide compact, inexpensive threshold and majority gate elements in integrated circuit packages for use in high density computer systems.

Yet another object of the present invention is to provide various logic circuits employing threshold and majority gate elements for performing the conventional digital logic functions of AND and OR gates, flip-flops, and full adders.

Still another object of the present invention is to provide signal conditioner circuits using improved threshold logic elements for converting various incoming logic signals into standard logic levels for use with threshold logic systems.

Still a further object of the present invention is to provide threshold logic arrangements for adding two or more multidigit binary coded decimal numbers in parallel in a single operation.

Yet another object of the present invention is to provide an improved analog-to-digital converter using threshold gating elements.

These and other objects are accomplished in accordance with the invention by providing unique threshold logic elements having precision thin-film resistors forming an input summation network and providing a voltage divider for establishing the desired threshold reference level. The input signals to the summation network are derived from a common voltage source, and the desired threshold level is set by connecting the voltage divider across this source. Thus, both the summation result and the threshold level maintain a constant proportionality relationship with variations in the voltage level of the source, thereby precluding any necessity for regulating or conditioning the various signal input levels and providing separate precision regulated threshold voltage sources, since any shift in the voltage level of the common source is reflected as a proportionate shift in both the threshold level and the summation level.

In accordance with one particular embodiment of the invention, the summation result is compared with the threshold level by means of a differential amplifier in order to maximize the advantages gained through use of precision thin film resistor networks. Two matched transistors with substantially the same gain are used in the differential amplifier to limit the differential error to less than 5 millivolts. In certain embodiments, the voltage divider resistance values are selected so that both transistors are driven from substantially equal and constant impedances, thus effectively cancelling the loading effect on the threshold and input summation circuits. Outputs from the differential amplifier are coupled to open either one of two low-impedance gates to connect an output terminal either to ground potential or the the supply terminal of the common voltage source, depending on the results of the comparison, so that the magnitude of the output signal voltage swing almost exactly equals the voltage of the common source. Accordingly, no need exists for conditioning the output signal or providing separate regulated power supplies to insure proper input levels to other elements in a system, and interaction between interconnected elements in a system is prevented since the output terminal is in effect coupled directly either to the power supply or to ground.

When such elements are actually used in threshold logic systems, it is desirable and sometimes necessary to have the capability of applying negative weights to the inputs. In one arrangement in accordance with the invention, the negative inputs may simply be applied to a separate negative input summation circuit which is coupled to vary the threshold level of the element. However, this requires that the comparator operate over a relatively wide range comparable to the maximum variation in the threshold level. Preferably, the same negation input effect is achieved by inverting the logic levels to the summation network for the normal positive weighted inputs. In this way, accuracy is not decreased by the necessity for operating the comparator over a wide range of threshold values. In actual systems where negative values are used quite frequently, each threshold gate element is provided with a complementary output arrangement to supply both positive and negative valued output signals for use as inputs to other elements in the system. The complementary output arrangement also avoids problems of interaction between system elements since, regardless of the output state, a low-impedance gate, such as a saturated transistor, shunts the output to ground potential. The resulting low impedance on the output lines prevents troublesome current leakages between the various signal paths in the system.

In accordance with a particular aspect of the invention, the precision resistors of the input summing network and the threshold divider network are evaporated onto a thermally conductive, electrically insulating substrate within a very small area and under identical conditions so that almost any variation occurring in one occurs proportionately in all others. Thus, the thermal and voltage coefficients, the effects of aging, and similar characteristics remain uniform in all of the resistors. Also, the deposition of the resistors in close proximity to one another on a substrate having good thermal conductivity effectively eliminates problems due to self-heating of the resistor elements, since a maximum temperature differential between any two resistors is kept to only several degrees. As a result, threshold gate elements in accordance with the invention can be produced at relatively low cost with a fan-in capability of 60 or more, and elements with even greater fan-in capabilities in excess of a hundred are possible at reasonable costs without departing from existing technology and production techniques. With such high fan-in and fan-out capabilities, sophisticated threshold logic systems become practical.

In accordance with another aspect of the invention, a threshold or majority gate element constructed in accordance with the invention may be adapted to operate as an input signal conditioner for converting the standard digital logic levels from other sources into those necessary for use with the elements of a threshold logic system. This is accomplished by setting the threshold level at a point approximately midway between the two digital signal levels. With majority logic elements, the terminal of the power supply is connected to appropriately weighted input resistors to provide an offset so that majority switching occurs at a point approximately midway between the two digital input levels. This requires that the total weight of all resistors connected to the voltage supply for obtaining the offset be approximately equal to the value of the total weight of all the input resistors connected to the digital input signal multiplied by the value obtained by subtracting from one the quotient resulting from dividing the voltage value midway between the two digital signal levels divided by the selected threshold switching level.

In accordance with a further aspect of the invention, several majority gate elements having high fan-in and fan-out capability can be interconnected to provide a relatively simple logic system for adding two or more binary coded decimal words, or performing similar arithmetic operations with other types of digitally coded numbers in a single operation. In a preferred embodiment used for adding two binary coded decimal words, each decade stage consists of five majority gate elements. Each individual bit of the two binary coded decimal words is connected to each of the five elements through an appropriately weighted input resistor corresponding to the value of that bit. Each decade stage receives from the next lower decade stage a carry signal output which is applied to all five majority gate elements through a weighted input resistor having a weight of one. Since the binary range of each decade is larger than the decimal range, a fixed input is applied to all elements as a logical bias or offset that serves to move the point at which a carry signal is generated down to the proper level for decimal operation. This fixed input has a weight of 11 for the first element, which generates the carry signal output, and a weight of 5 for each of the four other elements, which generate the respective bits of the binary coded decimal output sum. Each of the four elements generating the bits of the output sum receive an input from the negative complementary output of the first element, which generates the carry signal, and from the negative complementary output of each of the other elements, which generate each of the more significant bits in the output sum. Each of these inputs is weighted to correspond respectively to the value of the carry signal, which is 10, and to the value of each of the more significant bits so that, as each is generated, a corresponding weight is subtracted from the total input to elements generating less significant bits.

With certain modifications and additions, similar systems for adding any number of binary coded decimal numbers or the like may be constructed using the basic principles of this aspect of the invention. For example, a system for adding three binary coded decimal numbers merely requires one additional majority gate element in each decade stage to generate a "carry-two" signal, in addition to the "carry-one" signal for the next higher order decade stage. Thus, each element of a higher order decade stage receives both "carry-one" and "carry-two" inputs through appropriately weighted input resistors. Each bit of the three binary coded decimal words to be added in a decade stage are introduced into each element in the stage through input resistors having weights corresponding to the numerical significance of the bit. Each element, as in the previous arrangement, also receives a fixed input to provide a bias or offset necessary for decimal operation. The first and second majority gate elements, which generate the carry-two signal and carry-one signal, respectively, each receive a fixed input with a weight of eight, and the other four elements each receive a fixed input with a weight of 2. As in the two-word adder, each element in the stage other than the first receives an input from the complementary output of those elements generating the more significant carries and output bits weighted in accordance with the significance of the bit or carry being generated.

In accordance with another aspect of this invention, a number of majority gate elements may be interconnected in a system providing a simple and accurate analog-to-digital converter. In a particular embodiment, eight majority gate elements are interconnected in a system to form an analog-to-digital converter having a resolution of one part in a hundred and providing a two-digit binary coded decimal output. In this example, the analog input signal is applied to each of the gates through an input resistor with a weight of 100. Each element also receives a fixed negative input with a weight of 59. Each of the elements generating the less significant bits in the output also receives an input from the negative complementary output of each of the elements generating more significant bits. Each of these inputs to an element is weighted to correspond to the significance of the corresponding more significant bits so that, when each more significant bit is generated, a corresponding weight is subtracted from the total input to the elements generating less significant bits. The value of the analog input signal in this instance has a range anywhere between the positive and negative levels of the complementary outputs from the elements. When the analog input is 80 percent of the difference in magnitude between the limits of this range, then the first element generates a positive or a "one" output signal for the most significant bit at its positive output terminal and provides a negative or "zero" signal to the input of each of the other elements generating less significant bits, the input having a weight of 80 to reduce the total summed inputs by that amount. Each element makes its decision in the order of its significance, with the final decision of each less significant element depending upon the decision made by the more significant elements.

These and other aspects of the invention may best be and appreciated by reference to the following detailed description taken in conjunction with the accompanying drawings, in which:

FIG. 5 is a schematic block diagram of a majority gating element used for performing an AND logical function in accordance with the invention;

FIG. 6 is a schematic block diagram showing a majority gating element capable of performing an OR logical function in accordance with the invention;

FIG. 7 is a schematic block diagram illustrating a flip-flop circuit consisting of majority gating elements in accordance with the invention;

FIG. 8 is a schematic block diagram showing a full adder circuit consisting of majority gating elements in accordance with the invention;

Figure 12:
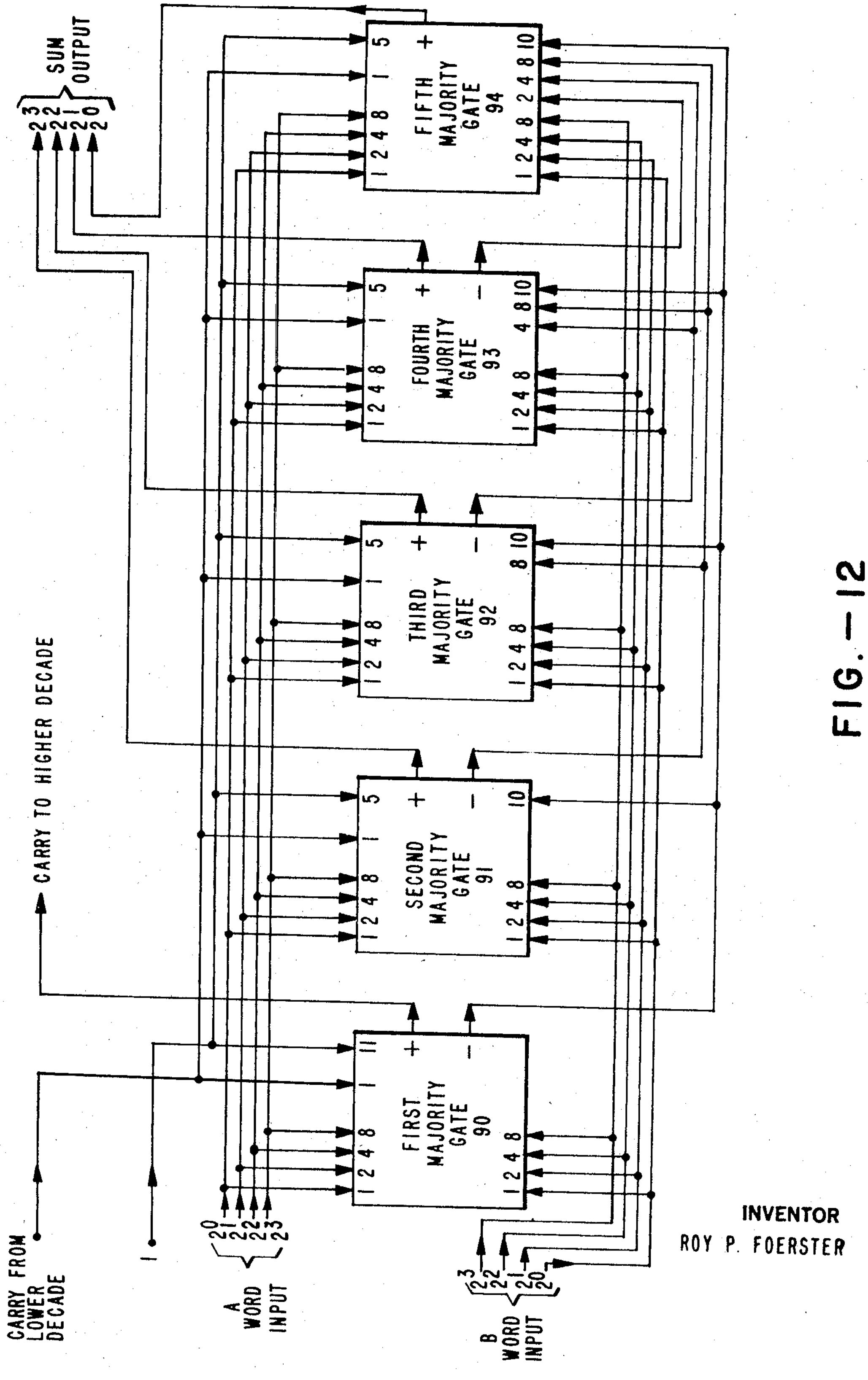
Figure 13:
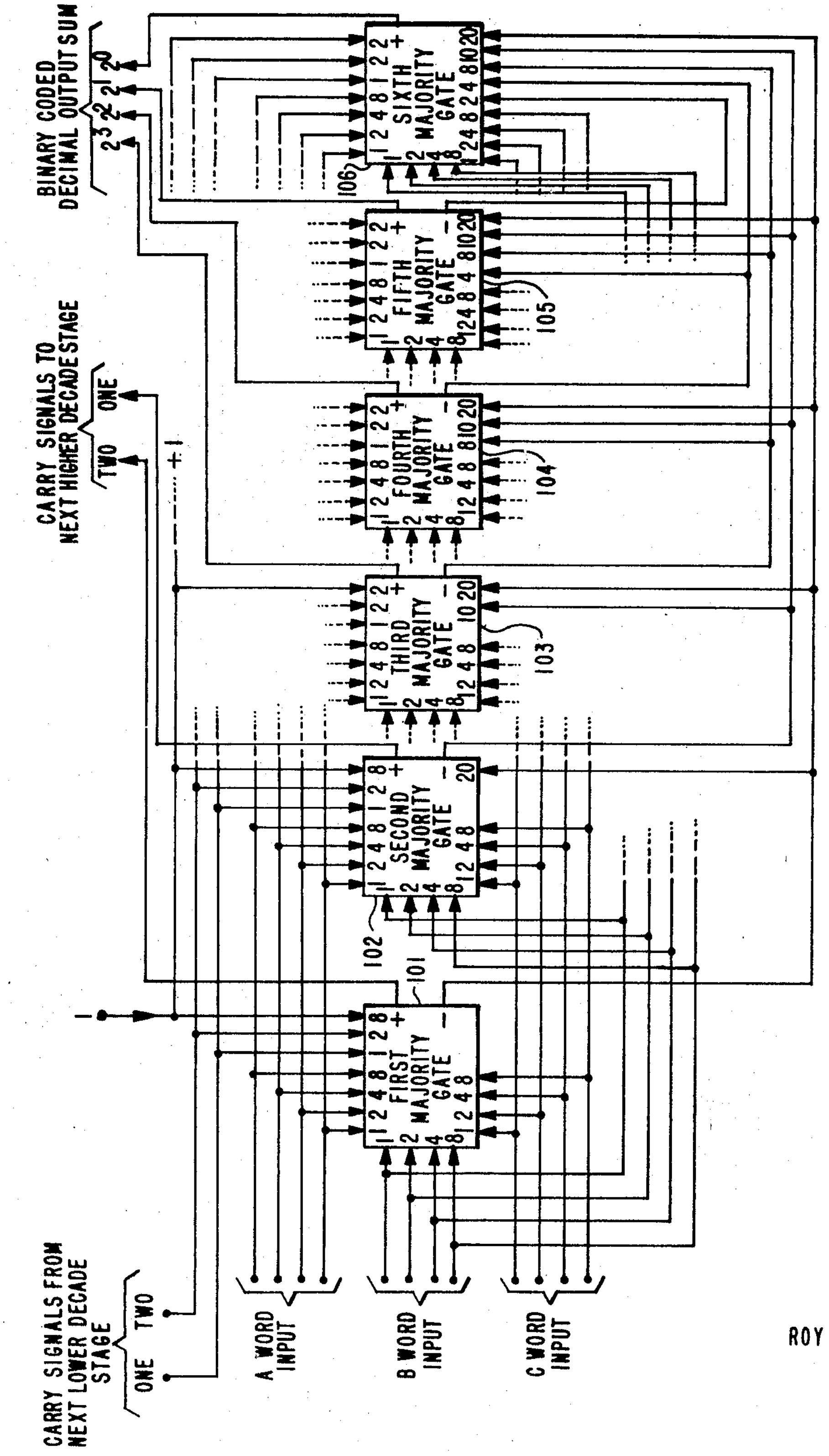
Figure 14:
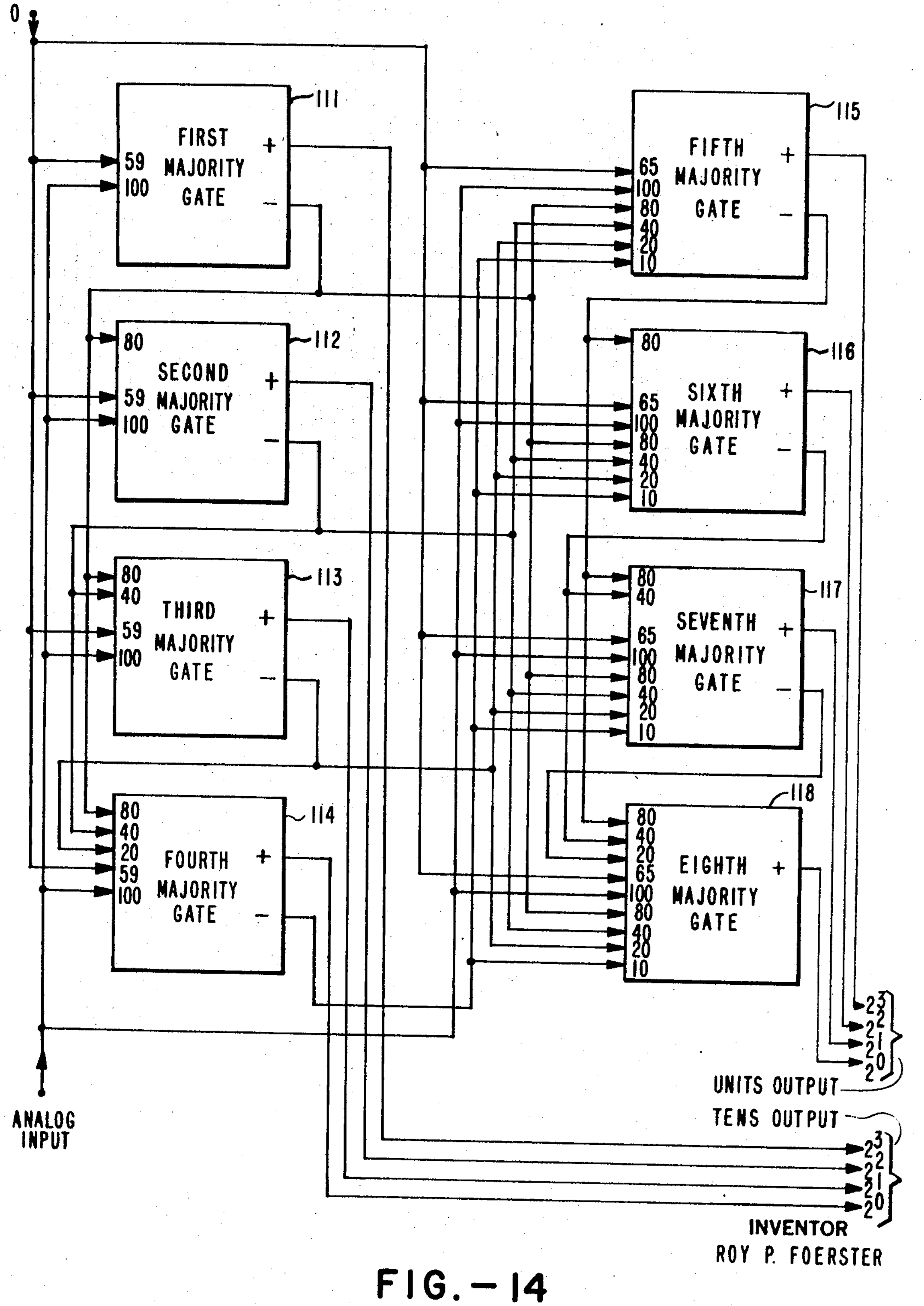

FIGS. 9, 10, and 11 are schematic block diagrams showing majority gating elements for conditioning commonly used digital signal levels for use with majority gating elements in accordance with the invention;

FIG. 12 is a schematic block diagram illustrating one decade stage of a majority gating logic system for adding two binary coded decimal words to provide a binary coded decimal output sum;

FIG. 13 is a schematic block diagram illustrating one decade stage of a preferred embodiment of majority gate logic system for adding three binary coded decimal numbers to provide a binary coded decimal output sum; and FIG. 14 is a schematic block diagram illustrating an analog-to-digital converter system employing majority gate elements for providing a digital output consisting of two binary coded decimal digits corresponding to the analog value of an input signal.

Figure 1:
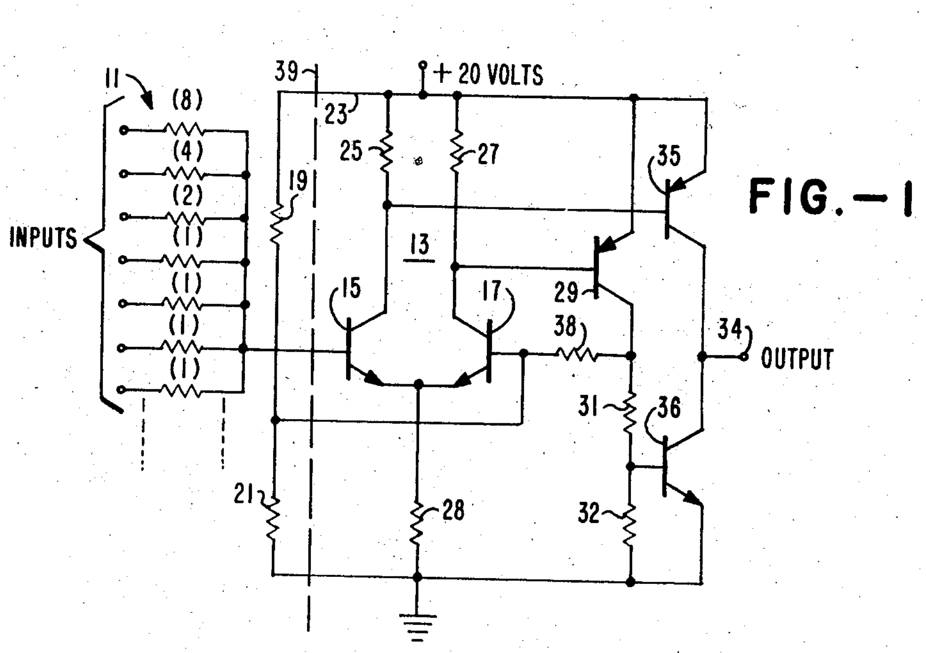
FIG. 1 is a circuit diagram of a preferred embodiment of a threshold gating element in accordance with the invention.

Referring now to FIG. 1, which illustrates a basic preferred form of circuit for a threshold logic element, various weighted inputs are summed in a Kirchoff resistive adder circuit 11 with the resulting sum being applied to one input of a voltage comparator circuit 13 to be compared with a preselected threshold voltage level applied to the other input. The summation network consists of various precision resistors, the values of which are accurately proportioned, in a manner hereinafter more fully described, with respect to each other to provide the desired weight to each input. The absolute value of each resistor is not important so long as accurate proportional relationships are maintained. For example, the smallest weighted input considered as having a weight of one uses some nominal resistance value R, such a 10,000 ohms, while other inputs having greater weights use proportionately smaller resistance values expressed as a fraction of the nominal value R. Thus, an input having a weight of two would be applied through a resistor with one-half the value of the nominal resistance value R, that is, 5,000 ohms, and a weight of 4 is given by a resistor equal to one-fourth R, or 2,500 ohms.

The input signals applied to the summation network are commonly digitally valued signals at preselected voltage values. In most systems, all inputs would be binary valued, having the same zero and one binary signal voltage levels, so that for purposes of computing the summation result the value of each input signal may be taken as either one or zero. With digital inputs other than binary and with binary input signals having different binary one signal voltage levels, a proper summation can be easily achieved merely by proper proportioning of resistor values so that the product of the signal input value times the weight of the resistor in each case has the desired effect on the total summation result, assuming, of course, that all zero-valued digital input signals have the same voltage level. For example, with two binary signal inputs both having their binary zero signal level at zero volts, but the first having a binary one signal level at plus 2 volts and the second at plus 4 volts, the resistor for the second would have proportionately twice the value of the resistor for the first, if the two binary one inputs were to be summed with the same weight. Thus, both binary one input signals would then have the same effect on the summation result in spite of the difference in voltage levels. When the input signals consist of multivalued digital inputs, the voltage values representing each digital value being proportionately related to the voltage levels of other digital values, the total fan-in to a threshold logic element is obtained by calculating for each input the maximum digital value of the input signal times its weight, and totaling the resulting products for all inputs to the summation circuit. Thus, if an element receives only binary valued inputs, the total fan-in equals merely the sum of all the input weights. On the other hand, if multivalued digital inputs are used, the weight of each input is multiplied by its digital value to obtain the total fan-in. Thus, if the summation network had one digital input value of four at a weight of 8, another of four at a weight of 4, another of four at a weight of 2, and finally one of seven at a weight of 1, the total fan-in would be 63, but, if all of the digitally valued inputs were binary, then the total fan-in would only be 15, which is merely the sum of the weights.

In the particular embodiment of FIG. 1, the results of the summation in the network 11 is applied to the base of an NPN-transistor 15 that is interconnected with a matching transistor 17 in a conventional differential amplifier 13 to operate as the voltage comparator. The threshold level with which the summation result is to be compared is established by a voltage divider circuit consisting of a pair of precision resistors 19 and 21 connected in series between a common supply voltage bus 23, typically at plus 20 volts, and ground potential. The reference voltage level existing at the output terminal of the voltage divider between the two resistors 19 and 21 is applied directly to the base of the transistor 17. The collector terminal of each of the transistors 15 and 17 is connected through one of a pair of load resistors 25 and 27, respectively, which are approximately equal in value, and the emitter terminals of the two transistors are connected together and through a common emitter resistor 28 to ground potential. As long as the voltage at the base of the transistor 15 resulting from the summation of the weighted inputs is below the preselected threshold voltage level at the base terminal of the transistor 17, the transistor 15 conducts little or no current while transistor 17 is conducting near or in full saturation. When the summation result exceeds the threshold level, then transistor 15 conducts heavily and transistor 17 becomes relatively nonconductive.

The collector terminal of the matched transistor 17 is connected to the base terminal of a PNP-transistor 29, the emitter of which is connected directly to the supply bus 23, so that the voltage developed across the load resistor 27 is applied between the emitter and base terminals of transistor 29 to control its conductive state. The collector terminal of the transistor 29 is coupled through a pair of series-connected load resistors 31 and 32 to ground potential. An output terminal 34 is connected directly to the collector terminals of a pair of complementary output switching transistors 35 and 36, both having extremely low impedances providing saturation voltages in the order of only 0.1 volt at saturation. The PNP output transistor 35 has its emitter connected to the power bus 23 and its base terminal connected to the collector of the transistor 15 in the voltage comparator. When the voltage level of the summation result exceeds the threshold reference level, causing the transistor 15 to conduct, the resulting voltage developed across its load resistor 25 causes the output transistor 35 to conduct in saturation, thus in effect shunting the output terminal 34 to the positive power supply to provide a positive voltage or plus one binary output signal. The NPN output transistor 36 has its emitter connected directly to ground potential and its base terminal between the series-connected resistors 31 and 32. In this way, the output transistor 36 is maintained nonconductive whenever the output transistor 35 is conductive since, with the transistor 17 off whenever the summation result exceeds the threshold, the high positive voltage applied to the base of the transistor 29 also renders it nonconductive, with the result that little or no current flows through the resistors 31 and 32. On the other hand, when the summation voltage does not exceed the threshold, the current flow through the transistor 17 turns on the transistor 29, producing substantial current flow through the resistors 31 and 32, and the resulting voltage drop across the resistor 32 then causes the output transistor 36 to conduct in saturation, thus in effect shunting the output terminal 34 to ground potential. In addition, since the transistor 15 is not conducting, there is little or no voltage drop across its load resistor 25, and the output transistor 35 is rendered nonconductive. Thus, depending upon the result of the comparison of the summation voltage with the threshold reference, the output terminal is connected through a very low impedance path either to the positive power supply or to ground potential. In this way, the output arrangement provides a high fan-out capability because the output voltage is relatively independent of the size of the load to which the output is connected.

The threshold voltage is set at any desired level between ground and the positive supply voltage by selecting appropriate values for the precision voltage divider resistors 19 and 21. Preferably, in order to provide maximum operation reliability, the threshold voltage level should be set at approximately one-half of an input step below the minimum value of the summation result intended to produce a binary one output signal. Thus, if the total fan-in to the summation circuit 11 is 50, and a binary one output is desired threshold the summation of weighted inputs exceeds 20, then the threshold voltage level should be set at a value corresponding to an input summation of 19½. In other words, the values of the resistors 19 and 21 should be chosen to have a ratio of 30½ to 19½. This insures maximum tolerance to variations in the input weight or voltage levels of the inputs and various other circuit value variations. To maximize the fan-in capability of a circuit, the two transistors 15 and 17 can be readily matched to reduce differential error to less than 5 millivolts.

The accuracy of the comparison is further enhanced if the two resistors 19 and 21 used in the voltage divider are chosen so that both transistors are driven from approximately equal and constant impedances. If all input signals are binary with equal voltage levels, as is normally the case, then this can be accomplished by making the value of the resistor 19 equal to the resistance value computed by dividing the nominal resistance value R by a number one-half less than the total weighted inputs equal to the desired threshold level, and making the value of the resistor 21 equal to that computed by dividing the nominal resistance value R by a number one-half less than the summation of all weighted inputs less those equal to the desired threshold. Thus, by matching the transistors for gain, and driving them with nearly equal and constant impedances, any loading effects of the comparator circuit 13 on the threshold and summation networks cancel one another.

The incorporation of a slight hysteresis effect is desirable, particularly in threshold logic systems having high fan-in capabilities such as those contemplated by the invention, in order to avoid any areas of indecision in the threshold logic by insuring that, once the summation result exceeds the threshold level, the output switches to a binary one state and remains there until the summation result drops below the threshold. The hysteresis must be much smaller than the smallest possible input logic step, or otherwise it would be impossible for the threshold element to make the proper decisions based on its current input values because it would tend to remain in one state, which might be in error with respect to a slightly delayed set of inputs yielding a summation result slightly on the other side of the threshold. In the embodiment of FIG. 1, a slight hysteresis of about one-tenth of an input step is provided by connecting a resistor 38, having a resistance value approximately ten times the nominal resistance value R, between the collector terminal of the transistor 29 and the base terminal of the transistor 17 to which the threshold reference voltage is applied. The value of the resistor 38 need not be precise, since a considerable variation would have no significant effect on the operation of the circuit.

Figure 2:
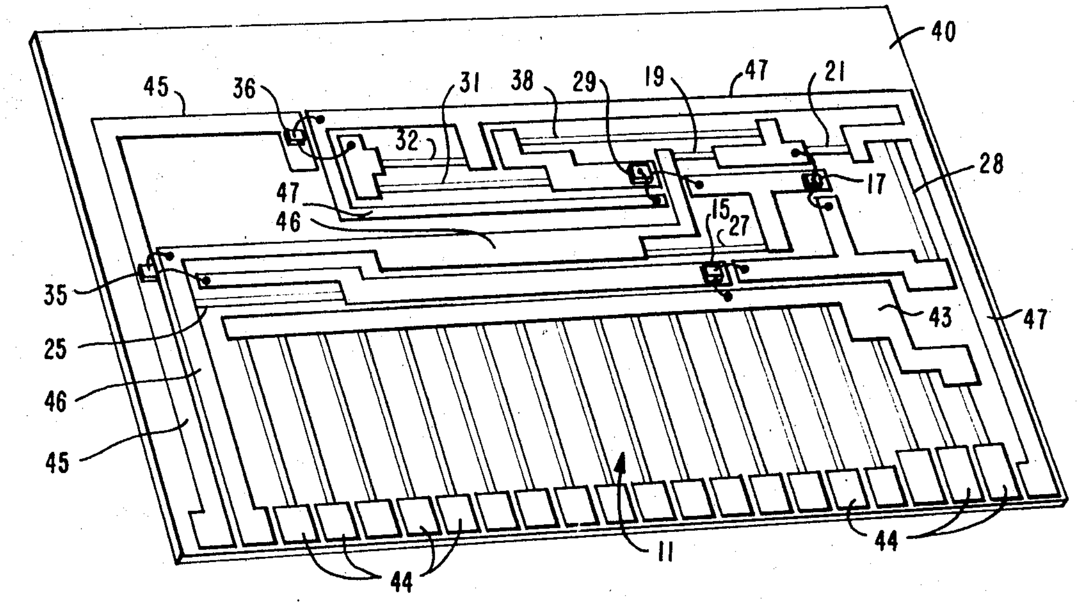
FIG. 2 is a perspective view of a threshold gating element constructed in accordance with the invention and corresponding to the circuit of FIG. 1.

Referring now to FIG. 2, which illustrates an actual threshold logic element corresponding to that of the circuit diagram of FIG. 1, the various circuit components are all included in an integrated circuit package of extremely small size particularly suitable for use in sophisticated logic systems. The precision resistance values necessary for achieving the high fan-in capability required for sophisticated threshold logic are obtained using existing thin film techniques for forming precision resistive strips on nonconductive substrates. As previously explained herein, the critical resistance values are those of the weighting resistors that form the input summation network 11 and the two resistors 19 and 21 of the voltage divider that establishes the threshold level. These are shown in FIG. 1 to the left of the dashed line 39. The other resistors, shown to the right of the dashed line 39 in FIG. 1, do not require such precise values, but for convenience may be formed in the same manner along with those that do, instead of using bulky conventional resistor elements. All the thin film resistors are deposited at the same time by the evaporation of a thin film resistive material, such as nichrome or Chromel-C, onto a single sheet of substrate material, such as glass, alumina, beryllia, or other metal oxide ceramics, which serves as an electrical insulator but has good thermal conductivity. The various circuit components are interconnected by thin film conductive strips deposited in much the same manner onto the substrate by evaporation.

Obtaining a precise ohmic resistance value for each resistor is not as important as providing an exact proportionality between the values of resistors 19 and 21 and those forming the summation network 11. Each resistor is a straight thin filmstrip deposited on the substrate 40, the resistance value of which is directly proportional to its length and inversely proportional to its width and thickness. Since the thickness of each resistor deposited is the same, different valued resistors have different lengths and widths so that the approximate desired proportions can be maintained between the different resistive values without the necessity for precise control of the thickness or quality of the resistive materials.

Various techniques are presently available for fabricating such thin film circuits and obtaining the precision resistance values necessary for the input summation network 11 and the voltage divider resistors 19 and 21.

In a preferred method of fabrication, the resistive material is deposited by evaporation as a layer of uniform thickness over the entire surface of the substrate sheet. Although the thickness of this layer need not be precise, it should be controlled to the extent necessary to insure that the resistance values for the resistors 25, 27, 28, 31, and 32 are within the range best suited for proper operation of the transistors in the circuit. The layer of resistive material is then covered with a thin film of conductive material, preferably gold, which is deposited by evaporation to cover the entire surface. Selected areas of the conductive layer are then removed by a photoetching process to leave the conductive strips and expose the underlying thin film layer of resistive material between strips. A second photoetch is then employed to remove selected portions of the exposed resistive material layer, leaving only the strips that form the various resistors. Of course, other thin film techniques may be employed, but the photoetching process described is probably easier and more reliable and accurate. The resistors formed in this way are within only a few percent of desired values. More exact proportioning is then achieved by comparing the resistance values, such as by use of a precision bridge network, and then trimming the thin filmstrips to adjust their resistance. For this purpose, certain scribing techniques are preferred in which fine lines are scribed into the film to form a pattern to increase the resistance value. In one such method, a very thin jet of abrasive material is applied to cut lines in the film, increasing the path length, and in another an electro-optically guided electron beam is used. These particular techniques will not be described herein, since they are known in the art and are not necessary to an understanding of the invention.

In the logic element shown in FIG. 2, the input summation network 11 consists of 16 thin film input resistor strips with a weight of one and three progressively shorter and wider resistor strips having weights of 2, 4, and 8, respectively. The weighted input resistors are disposed parallel to each other, and each has one end in contact with a common conductive strip 43, which is connected by a wire lead to the base terminal lead of the transistor 15, and the other end in contact with a separate conductive tab 44, to which an input signal connection can be made. To simplify the connection to the other external circuitry, conductive strips 45, 46, and 47, which are for the output signal, the positive voltage supply, and the negative or ground potential, respectively, extend to form tabs along the same edge of the substrate sheet 40. This permits the individual elements to be held in place with all the connections being made through a single multiterminal connector on that edge. Each transistor in the circuit is a transistor chip with its collector terminal on the underside directly in contact with one of the conductive strips. The emitter and base terminals are connected by wire leads to adjacent conductive strips, the emitter terminal being shown on top and the base terminal on one side of the transistor chip, for purposes of this illustration. Also, the size and spacing of the various thin film resistors and conductive strips are shown enlarged with relation to the size of the individual transistor chips to simplify the drawings, but in an actual circuit may be made much smaller to conserve space and permit the individual elements to be packed together with a high density in a system. The remaining circuit elements and connecting strips shown in FIG. 2 are not described herein, since they correspond to the circuit shown in FIG. 1, in which the various circuit elements bear like reference numerals.

By use of the thin film techniques herein described, a complete threshold gate element can be fabricated to from an integrated package only several hundred mils on the side. The formation of all resistors simultaneously in such a small area under identical conditions results in all having substantially the same characteristics so that thermal coefficients, aging effects, and other factors tending to cause variations in resistance values tend to be uniform for each resistor in the circuit. In addition, the effects of self-heating on the resistors, which is normally a serious problem, are minimized since the resistors are all in intimate contact with the substrate sheet 40, which has very good thermal conductivity. Thus, with all the resistors in such a small area, the maximum temperature difference that can exist between any two of them is very small. In particular, using an alumina substrate with the resistors of the input summation network 11 all contained within an area 300 mils wide by 400 mils long, the maximum temperature differential cannot exceed approximately 6.8° C., which would produce a maximum error in resistance values of only 0.034 percent, which is negligible. Moreover, since the threshold level is set by use of the voltage divider consisting of the resistors 19 and 21, and all input signals are referenced to the power source, any variation in the voltage level of the power source produces a proportional change in both the input signal and threshold voltage levels. Thus, the threshold gating circuit elements of this invention operate with an inherent constant proportionality that insures the accuracy of the threshold logic decisions in spite of variations in temperature and voltage levels.

The circuit of FIGS. 1 and 2 has been broadly described herein with relation to threshold gates, instead of merely majority gates. From the standpoint of the logic function performed, these two types of gates are completely equivalent, the majority gate being merely a specialized version of the broader classification of threshold gates. In a majority gate the threshold level is set to produce switching to a first output level whenever the sum of all the weighted inputs of one polarity exceeds or equals half of the maximum value of all the weighted inputs. With the circuits in accordance with this invention, the majority gate configuration has certain practical advantages in providing a balanced circuit operation that more fully utilizes the constant proportionality characteristics of the thin film resistors in the circuit.

In particular, the threshold level of the majority gate is set approximately half an input step below half the total voltage difference between the positive power supply and ground. Thus, in the circuit of FIGS. 1 and 2, the voltage divider resistor 19 has a resistance value equal to twice the nominal resistance value R divided by one less than the maximum value of all the weighted inputs, and the other voltage divider resistor 21 has a resistance value equal to twice the nominal resistance value R divided by one more than the maximum value of all the weighted inputs. As a practical matter, systems employing majority logic are preferred, since the values for the voltage divider resistors 19 and 21 are the same for each element, thus facilitating the fabrication of large numbers of elements with identical circuit values. Moreover, as hereinafter more fully explained, such majority gate elements can be made to perform any threshold function simply by the introduction of fixed inputs to offset the switching point to the desired setting.

Figure 3:
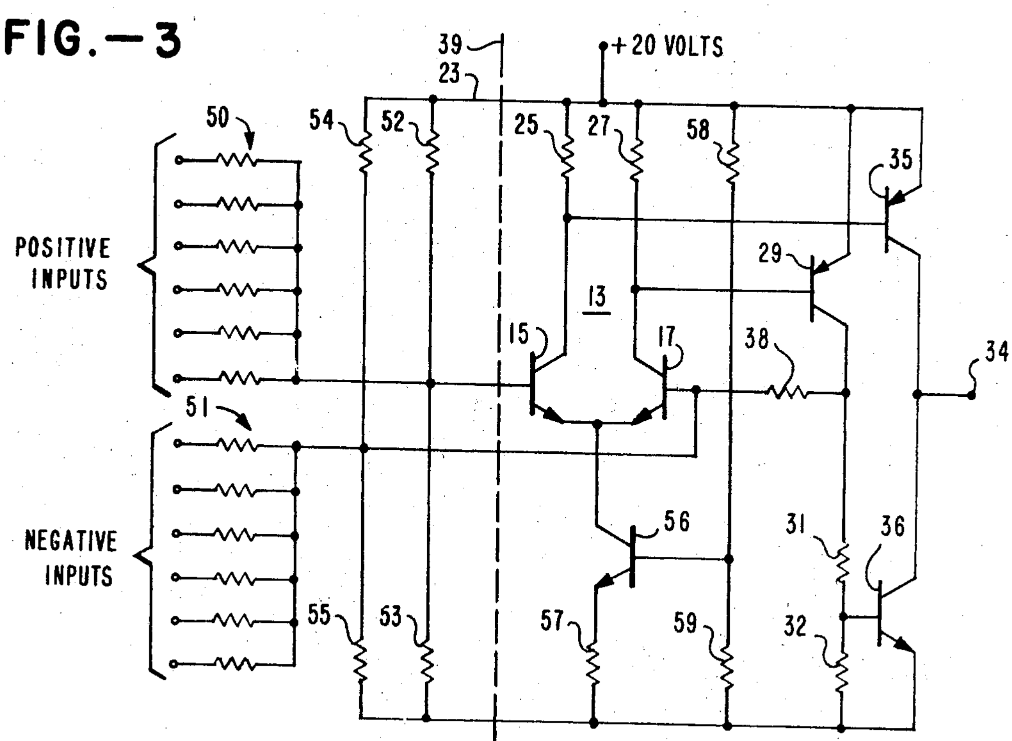
FIG. 3 is a circuit diagram illustrating an alternative embodiment of a majority gating element in accordance with the invention.

Referring now to FIG. 3, threshold gating elements used in actual systems frequently must be capable of resolving both positive and negative input signals. With the arrangement shown in FIG. 3, identical positive and negative input summation networks 50 and 51, respectively, are provided for receiving positive and negative signals that have the same amplitude and polarity. As shown, the output of the positive summation network 50, which receives only positive input signals, is connected to the midpoint of a voltage divider circuit consisting of resistors 52 and 53 and to the base terminal of the transistor 15 of the differential amplifier comparison circuit 13. Similarly, the output of the negative summation network 51, which receives only negative input signals, is connected to the midpoint of a voltage divider consisting of resistors 54 and 55 and to the base of the other transistor 17 in the differential amplifier comparison circuit 13. The resistance values for the resistors 52, 53, 54, and 55 can be selected to provide any desired threshold operation. As a majority gate, the resistors 54 and 55 have values corresponding to those of the resistors 19 and 21, respectively, of FIG. 1, the values of which were computed to provide majority gate operation. The resistors 52 and 53 forming the voltage divider for the positive input summation would have the same value equal to twice the nominal resistance value R divided by the maximum value of the weighted inputs. If the circuit is to operate other than as a majority gate with some preselected threshold, wherein the sum of the inputs of one polarity exceeds the sum of the inputs of the other polarity by a given amount, then the values of the voltage divider resistors are selected accordingly so that, without any inputs to either input summation circuit 50 or 51, the difference between the output voltages of the two voltage dividers is one-half of an input step less than the excess of the inputs of one polarity at the desired switching point. Preferably, in order to achieve the optimum balance in the driving impedances on both sides of the comparator circuit 13, the resistance value selected for the resistors 52 and 53 and those selected for the resistors 54 and 55 should be such that the voltages established at the base terminals of the transistors 15 and 17, without any inputs of either polarity, are equidistant from the voltage levels that would be established for majority gate operation. To illustrate, assume that the maximum valuc for all inputs is an integral number N, and that the threshold is to be set to produce switching to a plus 1 output whenever the algebraic sum of the positive and negative inputs is equal to plus 10. In this case, then, the value of the resistor 52 would equal the quantity obtained by dividing twice the nominal resistance value R by N minus 10, and the resistor 53 would have a value equal to twice the nominal resistance value R divided by N plus ten. For the other voltage divider, the value of the resistor 54 would be equal to twice the nominal resistance value R divided by N plus 10 minus 1, or N plus 9, whereas the value of resistor 55 would be equal to twice the nominal resistance value R divided by N minus 10 plus 1, or N minus 9. With no inputs applied, the voltage at the base terminal of transistor 15 is thus five input steps below, and the voltage at the base of transistor 17 five input steps above, the corresponding operating voltages established for majority gate operation.

The emitter terminals of the comparator transistors 15 and 17 are connected to one another and through an NPN-transistor 56 and an emitter resistor 57 to ground. A voltage divider consisting of the resistors 58 and 59 applies a fixed voltage to the base terminal of the transistor 56. This arrangement maintains the current flow through transistor 56 and thus the total current flow through the transistors 15 and 17 of the comparator circuit 13 constant throughout the entire range of voltages being compared.

In operation, when a negative input signal is applied through the negative summation network 51, the threshold voltage level established at the base of the transistor 17 is raised by an amount corresponding to the value of the weighted input. A corresponding weighted input from the positive summation network 50 is thus necessary to overcome the effect of the negative input by raising the input voltage at the base of transistor 15 by the amount which the threshold level has been offset. Thus, switching does not occur until the total of all positive input signals exceeds the total of all negative input signals by the preselected number of input steps equal to the desired threshold.

However, with this arrangement, certain problems may arise in achieving the desired accuracy of comparison over such a wide range of voltages.

Therefore, the capability of handling negative input weights is probably best achieved by an arrangement in which positive and negative valued input signals are applied to the single input summation network 19 shown in FIG. 1. By thus inverting the logic levels of the input signals themselves, instead of using the same logic levels for two different input networks as in the circuit of FIG. 3, accuracy is not affected by the necessity for operating the comparator circuit over wide voltage ranges. Thus, by merely using positive and negative valued input signal voltages, the threshold logic circuit shown in FIG. 1 is provided with the capability of handling negative input weights.

With individual logic elements, or a small number of interconnected elements, the negative valued input signals can be obtained merely by connecting a simple inverter circuit to each of the inputs to invert the logic input level. Thus, a plus one input signal is inverted to become a minus 1. As a practical matter, for the element of FIG. 1 designed to handle binary inputs, the plus 1 voltage level is selected as that of the positive voltage source, the minus 1 voltage level as that of ground, and zero or no input as a voltage midway between ground and the positive source.

Figure 4:
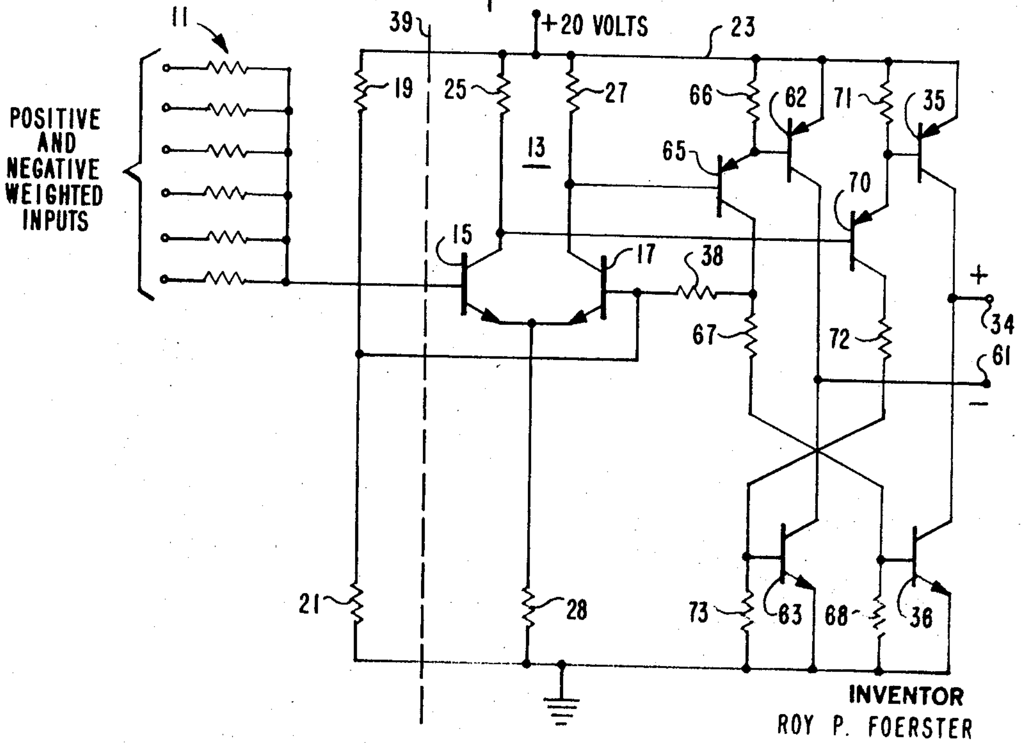
FIG. 4 is a circuit diagram illustrating a preferred embodiment form of majority gating element particularly suited for use in systems in accordance with the invention.

Referring now to FIG. 4, the positive and negative valued signals may be generated as complementary output signals from the threshold circuit elements. Such a complementary output arrangement requires only a few additional circuit components with the basic circuit of FIG. 1. In a complex system, where the output signals of one gating circuit are applied as input signals to others, this is much better than providing a separate inverter circuit for each negative input, and in most cases results in an actual reduction in the number of circuit components and overall system complexity. Positive or negative input signals are supplied to the input of any element merely by selecting the proper complementary output from the element in the system supplying the particular input.

The circuit components shown in FIG. 4 that correspond to those shown in FIG. 1 bear like reference numerals in FIG. 4. The input summation and threshold comparison operations of the circuit of FIG. 4 are identical to the corresponding operations previously described in connection with FIG. 1 so that only the complementary output arrangement need be described herein. To simplify the description to follow, it is assumed that the circuit values are chosen for operation of the circuit as a majority gate with binary positive and negative input and output signals. A binary signal with a plus 1 value has a voltage level equal to the positive voltage supply bus 23, and a signal having a minus 1 value is at ground potential level.

As in FIG. 1, the positive valued signals are generated on the output terminal 34, the binary value depending upon whether the switching transistor 35 or the switching transistor 36 is conducting. A plus 1 output signal is generated on the terminal 34 when the sum of positive weighted inputs is greater than the sum of negative weighted inputs to the summation network 11. In that case, the switching transistor 35 is conductive, and the switching transistor 36 is nonconductive. Similarly, a negative output terminal 61 is coupled to the collector terminals of each of a pair of opposite-type switching transistors 62 and 63, a PNP-transistor 62 with its emitter terminal coupled to the positive supply bus 23, and an NPN-transistor 63 with its emitter terminal connected to ground. Thus, the negative valued output signal on the terminal 61 depends upon which of the two switching transistors 62 and 63 is in a conductive state, the other being nonconductive, and the binary value of this negative valued output signal is always directly opposite the binary value of the positive valued output signal on the output terminal 34. Thus, when a plus 1 output signal equal to the positive supply voltage is generated on the positive output terminal 34, a minus 1 output signal at ground potential is generated on the negative output terminal 61. This means that output switching transistors 35 and 63 are conducting in saturation, and transistors 36 and 62 are nonconductive. On the other hand, when there is a minus 1 generated at the positive output terminal 34, there is a plus 1 generated on the negative output terminal 61. Thus, the switching transistors 62 and 36 are conducting in saturation and the switching transistors 35 and 63 are nonconductive.

In the complementary output arrangement of this embodiment, the switching of the transistors 36 and 62 is controlled through an amplifier arrangement including a PNP-transistor 65 that has its base terminal connected to the collector terminal of the transistor 17 to receive the output from the voltage comparator circuit 13. The emitter of the transistor 65 is connected to the base terminal of the switching transistor 62 and through a small emitter resistor 66 to the positive bus 23, and its collector is connected through a pair of voltage divider resistors 67 and 68 to ground potential. The base terminal of the transistor 36 is connected to the midpoint of the voltage divider between the resistors 67 and 68. Similarly, the switching of the transistors 35 and 63 is controlled by a similar amplifier arrangement including another PNP-transistor 70 connected with its base terminal to the collector terminal of the transistor 15 to receive the output from the voltage comparator circuit 13. The emitter of the transistor 70 is connected to the base terminal of the switching transistor 35 and also through a small emitter resistor 71 to the positive supply bus 23, and its collector terminal is connected through a voltage divider consisting of resistors 72 and 73 in series to ground. The base terminal of the output-switching transistor 63 is connected to the midpoint of the voltage divider between the resistors 72 and 73. In operation, when the summation result does not exceed the threshold, the current flow through the resistor 17 produces a voltage drop across its load resistor 27, which causes the amplifier transistor 65 to conduct heavily, thereby producing a voltage drop across the emitter resistor 66 that places the switching transistor 62 in a conductive state to generate plus 1 output at the negative output terminal 61. Also, the current flow through the transistor 65 causes a voltage drop across the resistors 67 and 68, the voltage across the resistor 68 placing the switching transistor 36 in a conductive state to generate a minus 1 on the positive output terminal 34. At the same time, the lack of current flow through the transistor 15 results in a negligible voltage drop across its load resistor 25 so that the amplifier transistor 70 is substantially nonconductive, and the switching transistors 35 and 63 are maintained nonconductive since there is little or no voltage drop across the resistors 71 and 73. Of course, when the summation result exceeds the threshold, the opposite situation obtains in which the current flow through the transistor 15 produces a voltage drop across the load resistor 25, causing the amplifier transistor 70 to conduct heavily to produce a voltage drop across the resistors 71 and 73 to turn on the output-switching transistors 35 and 63 and generate a plus one on the positive output terminal 34 and a minus 1 on the negative output terminal 61. At the same time, the lack of current flow through the transistor 17 results in a negligible voltage drop across its load resistor 27, thus cutting off the amplifier transistor 65 and rendering the switching transistors 62 and 36 nonconductive. In this arrangement, the resistor 38 used in producing the desired hysteresis effect is connected between the collector terminal of the transistor 65 and the base terminal of the transistor 17. This corresponds to the hysteresis arrangement of the circuit of FIG. 1.

In certain cases, particularly in systems applications, the circuit may be modified to add some additional logical functions which force the output to a particular state independent of the result of the summation input. These forcing functions, as they are sometimes called, may be used when, in a particular logical operation, one weighted input to the gating element is greater than any other combination of weighted inputs. Instead of using valuable fan-in capability to accept this input, it may be applied to separate forcing circuits to insure that the output signal assumes the proper state. The particular circuitry that may be used to provide these forcing functions is not illustrated and described herein, since various means of accomplishing this by modifying the circuit arrangements shown should be obvious to those skilled in the art. For example, forcing a zero output signal merely involves grounding or lowering the voltage at the base terminal of the transistor 15 in the differential amplifier comparison circuit 13 to a point significantly below the switching threshold. Typically, the circuit employed may simply be a PNP gating transistor with its collector connected to the base of the transistor 15, its emitter connected to ground potential, and its base terminal connected to receive a positive valued zero forcing input signal. On the other hand, a plus 1 output might be forced either by raising the voltage on the base of the transistor 15 above the threshold by shorting it through a lower impedance gate to the positive power supply, or preferably, to avoid feedback through the input summation circuit, by using an NPN-gating transistor with its collector connected to the collector output of the transistor 15 and through a diode to the base of the transistor 17 so that, when the positive valued forcing input is applied to the base of this transistor, it conducts in or near saturation to remove the normal threshold voltage from the base of the transistor 17 and lower the base voltage to near ground potential, and also to lower the voltage signal on the collector of the transistor 15 to insure that the switching transistor 35 is rendered conductive. A null output, which means an output representative of neither binary value, is forced by applying a positive forcing output to an arrangement which operates to connect the base of the switching transistor 35 to the positive supply bus 23 and the base of the switching transistor 36 to ground potential, so that both output transistors 35 and 36 are rendered nonconductive. Typically, such an arrangement would employ a PNP transistor with its base connected to receive a positive valued null forcing input signal, its collector connected through a resistor to the positive voltage supply bus 23, and its emitter connected through a resistor to ground potential. When this transistor is rendered conductive by the null forcing input, the voltages developed across its collector and emitter resistors are applied to the bases of opposite-type switching transistors, the PNP transistor of the pair being connected with its emitter to the positive power supply bus and its collector to the base of the output switching transistor 35, and the NPN transistor being connected with its emitter to ground and its collector to the base of the output switching transistor 36. Both transistors conduct in saturation, thus effectively shorting the bases of the switching transistors to their emitters, causing both to become nonconductive.

The majority logic circuits in accordance with the present invention can be fabricated in large numbers with selected standard weights for the summation network 11. In a system, a given input signal may then be applied to one or more inputs having standard input weights to give a total input weight equal to the desired value. For example, with the circuit shown in FIG. 2, a desired input weight of 10 can be obtained by connecting an input signal to the end tab 44 of the resistor on the far right, which has a standard input weight of 8, and also to the tab 44 of the second resistor to the left, which has a standard input weight of 2, or the signal can be applied to 10 resistors having input weights of one each, or any other combination where the input weight of all the resistors to which the particular input signal is applied equals 10.

Frequently, not all of the input resistors in a standard summation network will be connected to receive an input signal. In such cases, in order to preserve the impedance balance so advantageous to the accuracy of the comparator circuit 13, the input resistors not connected to receive an input signal should, as far as possible, be connected either to the positive power supply bus 23 or to ground potential so that the total of the input weights of those connected to one is exactly equal to the total of the input weights of those connected to the other.

The threshold and majority gating circuits described herein in accordance with this invention lend themselves to certain modifications in the fabrication techniques described in connection with FIG. 2 which can be used to simplify the hybrid construction shown therein and produce a more reliable unit. Instead of using separate transistor chips and interconnections for each of the transistor elements, as shown in FIG. 2, present integrated circuit techniques can be used to combine various transistor elements in a single monolithic circuit chip. The transistor circuitry employed has only two critical requirements, namely, that the transistors 15 and 17 in the differential amplifier comparator circuit 13 must be closely matched, and the output transistors 35 and 36, and possibly 62 and 63 in the embodiment of FIG. 4, must have relatively low-saturation voltages. With the presently available techniques, a single integrated circuit chip can readily be made to satisfy these requirements, and in the case of the circuit embodiment shown in FIGS. 1 and 3, only six connections are made to the chips. Additions of further circuit components to the chip, such as would be needed with the embodiment shown in FIG. 4, do not significantly increase costs, since any additional cost would primarily result from a slightly decreased chip yield in the fabrication of the chips themselves and the necessity for making added connections.

Also, although it is theoretically possible to evaporate the precision resistors as thin films onto the surface of the semiconductor chip containing the remaining circuit components, this is not as yet completely practical. At present, the substrate preparation on which the resistors are deposited remains a rather critical operation, and for several other reasons present attempts to marry precision thin film resistors with the surface of a passivated integrated semiconductor chip have not been too successful. However, when certain practical difficulties have been overcome, it will be possible to produce a single monolithic chip of very small size containing the entire circuit. Even with the precision resistors on alumina or glass substrates with the single monolithic chip mounted thereon, the assembly may be mounted in conventional flat-packs currently available with 24 to 40 lead connections.

Threshold and majority gate elements having the high fan-in and fan-out capabilities such as those achieved by the circuits hereinabove described lend themselves to the fabrication of practical threshold logic systems. Although many logical functions are best performed by conventional digital logic, others can best be performed using the analog capabilities of threshold and majority logic systems. Frequently, a system may have to perform some functions best performed by conventional digital logic and also other functions best performed by threshold or majority logic. In these cases, particularly where there is a considerable demand for both types of logic functions, optimum efficiency is achieved by the use of both types of logic. The logic elements of each type form two separate subsystems each for performing those particular logic functions for which it is best suited. However, conventional digital logic elements employ standard binary code formats quite different from those employed in threshold logic, and this requires interface equipment for converting from one logic format to the other in transferring data between the two systems. However, in systems where practically all the logic operations are best performed by threshold and majority gate logic, any necessary conventional digital logic functions can be performed by standard threshold or majority logic elements, thus avoiding the need for interface equipment. Majority gate elements are preferred, since these possess certain advantages in balanced operation and ease of fabrication which make them particularly useful for most system applications.

Referring now to FIG. 5, a majority gate element 80, such as those previously described herein, is shown connected to perform the conventional digital logic operation of an AND and NAND gate. For the purposes of this illustration and those to follow, the majority gate elements are shown in block diagram form and represent a majority gating element of the type, as illustrated in FIG. 4, that provides complementary outputs. The inputs are illustrated by the arrows directed into the majority gate, with the weight of each input indicated by a number within the block directly adjacent the point of the arrowhead. The positive and negative complementary outputs are illustrated by the arrows directed away from the gate, the positive complementary output having a plus sign and the negative complementary output a minus sign within the block adjacent thereto. In the particular arrangement shown, there are four binary input signals applied to the input summation network of the majority gate 80, each of which has a binary value of either plus one or zero. In addition, a fixed binary zero input signal with a weight of four is applied to the majority gate input to serve as a logical offset in the operation of the majority gate 80.

As in conventional digital AND gates, a binary one is generated on the positive output of the majority gate 80 only when all four input signals have a binary one value. In this situation, and only this situation, will the summation of weighted inputs with a binary one value equal the total weight of the inputs with a binary zero value. When one or more of the binary inputs is zero, then the summation of the weighted inputs with a binary one value is less than the summation of binary zero weighted inputs, and a binary zero is generated on the positive output. Of course, the signal generated on the minus output of the majority gate 80 has a binary value opposite that of the positive output, so that the negative output is a binary one when one or more of the four inputs is a binary zero, and the negative output is a binary zero when all four inputs have a binary one value. The majority gate 80 may be used to perform the AND and NAND gate functions for any number of binary inputs up to the limit of the fan-in capability of the particular majority gate element merely by making the weight of the fixed offset input equal to or one less than the number of binary signal inputs. In fact, the weights of the input signals and offsets in these and the various other applications described herein may have any number of value combinations which will maintain the desired operation so long as the proportions between the different weights are within certain limits. For example, each of the four input signals to the gate 80 might be applied with a unit weight of 4, and the weight of the fixed offset might be set at any convenient value in the range from slightly above 8, which is twice the unit weight of the other inputs, to not more than 16. Moreover, the unit weights for the inputs need not be equal to one another. In such a case, the weight of the fixed offset is merely chosen in the range from slightly more than the combined weight of the three largest inputs minus the weight of the smallest to not more than the combined weight of all four. Similar modifications can be made in the input weights of each of the other logic applications shown herein while still maintaining the desired operation.

As shown in FIG. 6, a majority gate element 81 serves as an OR and NOR gate for four separate binary inputs by introducing a fixed binary one offset with a weight of two. Thus, if any of the four binary inputs has a binary one value, then the summation of binary one weighted inputs equals or exceeds the summation of binary zero inputs, and the gate 81 generates a binary one signal on its positive output and a binary zero signal on the negative output. When none of the four inputs has a binary one value, then the summation of the four binary zero inputs to the majority gate 81 exceeds the weight of the fixed binary one input, and a binary zero is generated at the positive output of the gate and a binary one is generated at the negative output. Obviously, the majority gate 81 may be made to perform the OR and NOR gate functions for any number of binary inputs simply by making the weight of the fixed binary one offset equal to either 1 or 2 less than the total number of binary signal inputs, so that the presence of a binary one on any of the binary signal inputs makes the summation of binary one valued inputs to the gate 81 either equal to or greater than the summation of binary signal inputs.

It should be noted that the logical arrangements shown in FIGS. 5 and 6 are able to perform the AND, NAND, OR, and NOR logical functions for large numbers of binary inputs with a single majority gate element. The maximum number of binary signal inputs is limited to approximately half the total fan-in capability of the majority element. With the high fan-in capabilities available with the majority gate circuits hereinbefore described in connection with FIGS. 1–4, this represents a substantial improvement over the maximum number of inputs that can be used with conventional digital circuits used for performing these logic functions. However, since it is seldom necessary to perform these logical functions for large numbers of inputs, using majority gate elements having high fan-in capabilities leaves a good proportion of the fan-in capability unused. On the other hand, the waste of fan-in capability is usually justified by the fact that both the input and output binary signal levels used in performing the logical functions are compatible with the input and output signal levels of the other majority gate elements in the system, thus avoiding the need for interface equipment to convert to and from conventional digital logic levels.

Referring now to FIG. 7, two majority gates 83 and 84 can be interconnected to function as a conventional flip-flop to switch alternately between set and reset states upon each occurrence of a binary one valued "change" signal or to be selectively placed in either the set or reset state. In the arrangement, the negative output of each of the two gates 83 and 84 is connected as an input with a weight of two to the other gate of the pair. The change input signal is applied with a weight of one to both majority gates 83 and 84. Also, the reset input is applied with a weight of 1-to-1 majority gate 83, and the set input is applied with a weight of one to the other majority gate 84. A binary one signal is generated on the positive output of the majority gate 83 when the flip-flop is in its zero or reset state, and a binary one is generated on the positive output of the gate 84 when the flip-flop is in its one or set state, as in conventional flip-flop circuits.

Assuming that the flip-flop is initially in its zero or reset state, the binary zero generated at the negative output of the majority gate 83 is applied with a weight of two to the input of the majority gate 84. The majority gate 84 generates a binary one on its negative output to be applied with a weight of two to the input of the majority gate 83. To obtain normal flip-flop operation, in which the output state of the flip-flop changes with each change signal received, the set and reset inputs to the gates 83 and 84 are both maintained at a binary one level. Upon receipt of a binary one valued change signal, the gate 84 switches to generate a binary zero at its negative output, which later causes the gate 83 to switch after the binary one change signal ceases. The set and change binary one inputs to the majority gate 83 have no immediate effect since, before the gate 84 switches, the input from the negative output of the majority gate 84 is initially a binary one and has a weight of two, so that the sum of the weights of binary one inputs is already at least equal to the combined weights of the other two inputs. However, the binary one signal on both the set and change inputs to the majority gate 84, each of which has a weight of one, makes the sum of the weights of the binary one inputs equal to two, and, since the binary zero applied from the negative output of the majority gate 83 only has a weight of two, the majority gate 84 switches to generate a binary one on its positive output and a binary zero on its negative output. The binary zero is then applied to the input of the majority gate 83 with a weight of two, so that as soon as the binary one of the change signal ceases, and this input to the gate 83 resumes its normal binary zero level, the total weight of binary zero inputs becomes three, while there is only a single binary one input with a weight of one. Thus, the majority gate 83 switches to generate a binary zero on its positive output and a binary one on its negative output. The binary one on its negative output, which is applied with a weight of two to the majority gate 84, holds it in its newly established state after the binary one change signal ceases. Upon the occurrence of the next binary one change signal, the majority gate 83 then switches to generate a binary one on its positive output, and the binary zero generated on its negative output causes the majority gate 84 to switch. Thus, on each subsequent application of a binary one change signal, the flip-flop switches between its set and reset states.

When the flip-flop is to be placed in either its set or reset state regardless of its present state, then a binary one input is applied only to the set or the reset input, depending upon the desired state, and a binary zero is applied to the other. The next change signal only causes switching if the flip-flop is in its other state. For example, if the flip-flop is to be placed in its reset state, the reset input of majority gate 83 receives a binary one and the set input of majority gate 84 receives a binary zero. Assuming that the flip-flop is already in its reset or zero state, the application of a binary one change signal has no effect on the majority gate 84, since the sum of the binary zero input from the negative output of the majority gate 83 and the binary zero set input is now three, whereas the binary one change input has a weight of only one. However, if the flip-flop was originally in its set state, then the total weight of the binary one valued change signal and the binary one reset input to the majority gate 83 equals the total weight of the single binary zero input from the negative output of the majority gate 84, thus causing the majority gate 83 to switch, which then causes the majority gate 84 to switch to place the flip-flop in its reset state.

Referring now to FIG. 8, two majority gates 85 and 86 may be connected to act as a full adder for three binary coded input signals. Each of the three binary coded input signals is applied with a weight of one to both majority gates 85 and 86. The majority gate 85 receives a fixed binary zero input with a weight of one, and the negative output of the majority gate 85 is applied with an input weight of two to the majority gate 86. When two or more of the three binary inputs are at a binary one level, the majority gate 85 switches to generate a binary one carry signal from its positive output, since the total weight of binary one inputs will equal or exceed the total weight of the binary zero inputs. When the majority gate 85 switches, a binary zero from its negative output is applied with a weight of two to the majority gate 86. Under this condition, all three of the binary signal inputs involved in the addition must have a binary one value to cause the majority gate 86 to switch and generate a binary one on its positive output. On the other hand, if the binary inputs do not contain two or more binary ones, then the majority gate 85 does not generate a binary one carry signal, and a binary one is generated on its negative output to be applied with a weight of two to the majority gate 86. This means that, if any one of the binary signal inputs being added is a binary one, then the majority gate 86 switches to generate a binary one at its positive output.

Referring now to FIGS. 9, 10, and 11, in those cases where threshold and majority gate logic is combined with conventional digital logic, a majority gate 88 makes an ideal interface element between the two types of logic for converting conventional digital logic levels to the binary levels needed for use with the threshold and majority gate elements. As shown in FIGS. 9, 10, and 11, depending on the binary levels of the conventional digital signals being converted, they are applied as inputs with a given weight to the majority gate 88 along with fixed offset inputs.

One common binary code format frequently used in conventional digital logic designates a binary one value with a positive voltage level of approximately 3 volts, and a binary zero value with zero or ground potential level, as shown in FIG. 9. In contrast, the majority or threshold gates in accordance with this invention employ the voltage on the positive power supply bus, in this case plus 20 volts, to designate a binary one value and zero or ground potential to designate a binary zero value. To convert the conventional binary signal levels, the binary signal is applied to the input summation network of a majority gate 88 with a total weight of 7, which in this particular instance is obtained with three separate standard input weights of 1, 2, and 4. The positive 20 volts from the power supply bus is applied as a fixed offset with a total weight of 6, which in this particular instance is obtained with two separate standard input weights of 2 and 4. With the fixed offset, the majority gate 88 is set to switch at a point where the voltage applied to the other input is approximately midway between the two conventional binary input levels received, that is, at a positive voltage of approximately 1½ volts. To convert another common binary code format, as shown in FIG. 10, in which a binary one is represented by a positive half-volt level and a binary zero is represented by a negative half-volt level, both the binary code input signal and the fixed offset are applied to the majority gate input with a weight of one. In FIG. 11, a conventional binary code format, in which a binary zero is represented by a minus 3-volt signal and a minus binary one is represented by a voltage level of minus 7 volts, is applied with a weight of 2 to the input summation network of the majority gate 88, while the fixed offset has a total weight of 3. In this case, a plus 20-volt signal on the minus complementary output of the majority gate 88 designates the binary zero value for use in the threshold logic, and a ground or zero potential the minus one binary value.

In each of the three examples described hereinabove, the majority gate 88 converts the different conventional binary code format to the format needed for the majority and threshold gate. In accordance with this aspect of the invention, any binary code format can be converted in this manner using either majority gates or threshold gate elements. Given a particular binary code format and knowing the switching level of the threshold and majority gate, the proper weight for the binary code and offset input can be easily determined. For any given input signal, the ratio of the total weight given to the binary input to the total weight for the offset should closely approximate the ratio of the difference between the positive power supply voltage and the threshold voltage level established for the elements to the difference between the threshold voltage level and the voltage midway between the two binary input levels. For example, with a majority gate element employing a positive power supply voltage of plus 20 volts, the threshold switching level is approximately 10 volts, that is, one-half of the positive supply voltage, and the desired ratio of total input weights to total offset weights should approximate the value obtained by subtracting one-tenth of the voltage midway between the two binary input levels from one. It should be noted that the values chosen for the input and offset weights need only approximate the ratio calculated, the closeness of this approximation depending upon the voltage difference between the two binary input levels. In the example of FIG. 9, an exact correspondence with the calculated ratio is obtained by providing a total weight of 20 for the binary input and a total weight of 17 for the fixed offset, but the weights of 7 and 6 as shown will suffice, even though the binary input levels may vary as much as plus or minus 1 volt.

Referring now to FIG. 12, one of the most useful system applications of threshold and majority gate elements which possess a high fan-in and fan-out capability of those disclosed herein is that of adding binary coded decimal (BCD) numbers. Previously, this function either could not be performed in a single operation or required excessive amounts of circuitry using conventional digital techniques. Basically, the problems faced by the designers of conventional digital equipment resulted from the fact that there are more than a few digits in each decimal number and the carries resulting from the addition of two decimal digits were extremely difficult to handle.

Referring now to FIG. 12, five majority gates 90, 91, 92, 93, and 94 are interconnected to form a single decade stage of a multistage system for adding two binary coded decimal numbers each having one or more decimal digits. Each decimal digit in the two numbers to be added consists of a four-bit binary input word. In accordance with the most widely used binary coding scheme, each binary bit is used to designate a progressively higher power of two; that is, as shown in the drawings, the least significant bit designates two to the zero power or one, the next more significant bit two to the first power or two, the third two to the second power or fourth, and the most significant bit two to the third power or eight. Thus, if in a particular word the binary value of both the most and least significant bits is a binary one, then the numerical value for that digit is nine.

In the arrangement shown, the particular decade stage shown receives a carry input from the next lower decade stage and generates a carry signal for the next higher decade stage. The two binary coded decimal digits to be added consist of four-bit binary word inputs A and B, which are summed with the carry signal from the next lower decade stage to produce a four-bit binary coded decimal word output and the carry signal for the next higher decade stage. Whenever the numerical value of the addition exceeds 10, the first majority gate 90 generates a binary one on its positive output to be carried forward to the next decade stage for addition with the two decimal digits of next higher significance that are added in the next higher decade stage. The positive outputs of the second through the fifth majority gates 91, 92, 93, and 94 constitute the four binary bits of the binary coded decimal digit output produced by the summation.

The binary bits of the A and B word inputs are applied to all five majority gates 90–94 with a weight equal to the numerical significance of the respective bits. Each of the gates also receives the binary carry signal from the next lower decade stage with an input weight of one, and a fixed binary one input is applied to the first majority gate 90 with a weight of 11 and to the second through fifth majority gates 91, 92, 93, and 94 with a weight of 5 to provide the necessary logical offset required for decimal operation. The negative output of the first majority gate 90, which generates the carry signal for the next higher decade stage, is applied to each of the second through fifth majority gates 91–94 with a binary weight of 10. Thus, when a binary one carry signal is generated on the positive output of the first majority gate 90, a binary zero is generated on its negative output to subtract, in effect, 10 units from the summation total in each of the other majority gates 91–94. On the other hand, when the summation of the two decimal digits and the carry from the lower stage does not exceed 10, the first majority gate 90 has a binary zero on its positive output indicating the absence of a carry to the next higher stage, and binary one on its negative output which is applied to each of the other gates. Each of the other majority gates 91–94 receives an input from the negative output of each majority gate that generates a more significant bit in the output sum, each such input having a weight corresponding to the numerical significance of the more significant bit being generated by the gate from which the negative output is obtained. For example, the fifth majority gate 94, which generates the least significant output bit, receives inputs with weights of 2, 4, and 8 from the negative outputs of the second, third and fourth majority gates 91, 92, and 93, respectively.

The operation of the binary coded decimal adder may best be understood by considering the following example. Assume that the numerical value of the A-word input for this decade stage is 9 and the numerical value of the B-word input is 5, and that a carry signal is received from the lower decade stage, thus making a numerical sum of 15. This means that, using conventional binary coding, the A-word at a numerical value of nine provides two binary one inputs which are applied with weights of 8 and 1 to each of the majority gates 90–94, and the B-word also provides two binary one inputs weighted 4 and 1. Also, the binary one carry signal from the preceding stage is applied to all gates with a weight of 1. The binary one fixed offset to the first majority gate 90 has a weight of 11, making the total of all binary one input weights to this gate equal to 26. On the other hand, the binary zero input bits from the A- and B-words are applied with weights of 2, 4, 2, and 8, resulting in a total weight of only 16. In accordance with the principles of majority gate operation as previously described herein, when the sum of the weights of the binary one inputs is thus greater than the sum of the weights of the binary zero inputs, the first majority gate 90 switches to generate a binary one carry signal on its positive output to be delivered to the next stage and a binary zero on its negative output to be applied in a subtractive sense to the remaining gates 91–94 with a weight of 10. Now, with the second majority gate 91, the binary one fixed offset has only a weight of 5. This makes the total of all binary one inputs to this gate 91 only 20, whereas the total of binary zero inputs counting the weighted inputs from the gate 90 is 26. Therefore, the second majority gate 91 does not switch to produce a binary one positive output for the most significant bit of the sum output. Instead, a binary zero is generated on the positive output of the gate 91 and a binary one on the negative output to be applied to the third, fourth, and fifth majority gates 92, 93, and 94, with a weight of 8. The sum of the binary one inputs to the third majority gate 92 is 28 and thus exceeds the sum of the binary zero weights, which is only equal to 26. Accordingly, the gate 92 switches to generate a binary one from its positive output as the second most significant bit of the output sum and a binary zero on its negative output to be applied with a weight of four to the fourth and fifth majority gates 93 and 94. The total weight of binary one inputs to the majority gate 93 is 28, and the total weight of the binary zero inputs is 30. Since the total weight of binary zero inputs is greater than the total weight of binary one inputs, a binary zero on its positive output and a binary one on its negative output are to be applied with a weight of two to the fifth majority gate 94. The fifth majority gate 94 receives a total weight of binary one inputs of 30 and an equal total of binary zero input weights, and thus switches to generate a binary one from its positive output as the least significate bit of the output sum from the stage. Accordingly, the numerical value of the binary coded output sum is five, having a binary one on both the least and second most significant bits, and a one is carried to the next higher decade stage, and this corresponds to the correct numerical total of fifteen.

It is to be noted that the majority gates generating outputs of less numerical significance in each decade stage cannot make a final decision until outputs of greater numerical significance have been correctly generated. Also the higher decade stages must wait for the completion of the addition in lower decade stages. Although some delay is involved in this technique, the operation is essentially a synchronous process that effectively permits the summation of binary coded decimal numbers in a single, if somewhat prolonged, operation using only five logic elements for each decimal digit. For this application, the majority gate elements require fan-in capabilities of approximately 60, which is quite easily obtained using the circuit and fabrication techniques described herein.

As shown in FIG. 13, the binary coded decimal adder principles may also be extended to include adder arrangements for three or more binary coded decimal number. The only limitation is the fan-in and fan-out capabilities of the individual majority gate elements. Only one additional majority gate element in each stage is required with the basic adder arrangement of FIG. 12 for the additional binary coded decimal word to be added in order to handle the additional carry signal that is generated. Actually, the arrangement is capable of handling the addition of four binary coded decimal numbers, since the maximum carry signal may be 3—1 plus 2. With the addition of another element to generate the carry four signal, the arrangement is capable of adding as many as eight binary coded decimal numbers, and so on.

The decade stage arrangement for adding three numbers has A, B, and C word inputs representing three corresponding bits having the same significance in each of the three multidigit binary coded decimal numbers. Each adder step requires only six majority gates 101, 102, 103, 104, 105, and 106. Each gate 101–106 receives both carry one and carry two signals from the previous stage weighted 1 and 2, respectively. The first majority gate 101 generates a carry two signal and the second majority gate 102 generates a one carry signal for the next higher decade stage. Each bit in each of the three binary coded word inputs A, B, and C is applied with a weight corresponding to its numerical significance to each of the majority gates 101–106. A fixed binary one offset signal is applied with a weight of 8 to the first and second majority gates 101 and 102, and to the four other majority gates 103–106 with a weight of two. The negative output of the first majority gate 101 is applied as an input with a weight of 20 to each of the other majority gates 102–106 in the stage, to subtract in effect the numerical significance of the carry two signal from the summation in each of these other gates. Likewise, the negative output of the second majority gate 102, which generates a carry one signal, is applied with a weight of 10 to each of the majority gates 103–106, and the negative outputs of these majority gates used to generate the bits of the binary coded decimal sum output are applied as inputs to those generating less significant bits with a weight corresponding to the numerical significance bit generated by the gate from which the signal is obtained.

The selection of the proper weight for the fixed offset input to the majority gate of like systems for adding any plurality of binary coded decimal numbers, or similar arrangements can be determined rather simply merely by calculating the total weight of all inputs to be added by each stage and subtracting from that total the total weight of all inputs from the negative outputs of the gates generating more significant carry or output digits. The remainder is then either more or less than twice the numerical significance of the output being generated by a particular gate. If more, then the fixed offset input should be a binary one with a weight that may be either equal to or one more than the difference. However, if the remainder is less, then the fixed offset input is a binary zero with a weight equal to or one less than the difference. For example, the total weight of all inputs to be added in the case of majority gate 101 is 48, a total of 15 for each of the three input words plus three for the combination one and two carried from the previous decade stage. The numerical significance of the carry two signal generated by the gate 101 is 20, and twice twenty is 40, which when subtracted from the total 48 leaves a difference of plus 8. Therefore, the fixed offset input to the majority gate 101 is a binary one with a weight of 8 or 9. With the third majority gate 103, the total of all input weights to be added is again 48, and the total weight of the inputs from the negative outputs of the gates 101 and 102 is 30, thus leaving a remainder of 18. Twice the numerical significance of eight of the output generated by this gate 103 is 16, which when subtracted from 18 leaves a difference of plus 2. Therefore, the fixed offset input to the third majority gate 103 is a binary one with a weight of 2 or 3.

Another serious problem area in conventional digital logic design is that of providing accurate and reliable analog-to-digital conversion or, more particularly, providing a multidigit binary coded number accurately representative of the amplitude of an analog input signal. Previously, the cost and complexity of the circuitry required to achieve this rather basic logic function was enormous, and the techniques used frequently required complex programming to perform numerous sequential operations, and the reliability and accuracy achieved was seldom more than marginally acceptable. Only in a few very special instances could the cost involved in performing this operation with conventional digital logic systems be justified in view of the results obtained.

Referring now to FIG. 14, threshold and majority gating elements having very high fan-in and fan-out capabilities, as previously described herein, are especially useful in the area of analog function application, and in particular to the realization of a simple, inexpensive, reliable, and highly accurate system for achieving analog-to-digital conversion. For one thing, a threshold gating element having such high fan-in capabilities serves as an extremely accurate voltage level protector to generate a binary one on its positive output whenever an input voltage exceeds a preset threshold level. Majority gates, because of the high resolution of the input summation network and the precision with which the switching threshold can be placed using the fixed offset techniques described herein, are particularly useful in this type of application, since the multiple inputs can be used to cause controlled shifts in the effective threshold level as various functions are performed.

Referring now to FIG. 13, one of the more useful applications of these threshold and majority gate techniques in performing analog functions, for example, employs only eight majority elements to generate a two-digit binary coded decimal number indicative of the amplitude of an analog input signal. The output at full decimal capacity provides 100 separate divisions of the amplitude of the input signal which, for the particular majority gates described herein, ranges from ground potential to the positive 20 volts of the positive power supply. Accordingly, each change of one in the numerical value of the output represents a change in the amplitude of the analog input of only 0.2 volt. Of course, if the full binary capacity of the arrangement is used, the maximum range of values for the input signal is substantially increased.

It should be noted that the operating voltages for the gates 111–118 may be shifted to handle any particular range of analog input voltages, and fixed offset inputs may be applied to shift the operating point of each of the gates. Also, the converter may be made to handle voltages of greater ranges, either by increasing the operating voltages used by the gates 111–118, or providing additional gates.

In the particular embodiment of FIG. 14, the analog input signal is applied to each of the eight majority gates 111–118 with a weight of 100. Also a binary zero input signal is applied with a weight of 59 to the first through fourth majority gates 111–114 and to the fifth through eighth majority gates 115–118 with a weight of 65. The positive outputs from the first through fourth majority gates 111–114 constitute the four binary bits forming the binary coded tens digit for the decimal output, and the positive outputs from the fifth through eighth majority gates 115–118 constitute the four binary digits forming the binary coded units digit of the decimal output. The negative output from each of the more significant majority gates 111–117 is connected as an input to all of the majority gates that generate the less significant output bits with a weight corresponding to the numerical significance of the particular gate from which the negative output is obtained. Thus, for example, when the first majority gate 111 is switched to generate a binary one on its positive output, the binary zero on its negative output is applied as an input to each of the other gates 112–118 to subtract in effect eight units from the summation of the inputs to that gate, and, when the fifth majority gate 115 is switched to produce a binary one on its positive output, the binary zero on its negative output is applied to subtract in effect eight units from the summation in each of the sixth, seventh, and eighth majority gates 116, 117, and 118, respectively.

In operation, when the analog input signal has an amplitude which is 80 percent or more of its full scale value, a binary one is generated on the output line from the positive output of the first majority gate 111. In the present arrangement, the first majority gate 111 is switched to produce a binary one output whenever the amplitude of the analog input signal is 15.9 volts, assuming that the 20 volt positive supply represents full scale. In this way, the switching point is placed midway between the 79th and 80th output step, so that the output is in effect rounded off to the nearest unit. Each gate makes its decision successively in the order of the significance of its output progressing from the first gate 111 to the eighth gate 118, the decision finally made by each gate depending upon the decisions made by all the preceding gates generating more significant output bits.

Although the threshold and majority gate circuits of FIGS. 1–4, and variations thereof as may occur to those skilled in the art, are particularly suited for use in the logic arrangements and systems described herein, any majority or threshold gate having the necessary fan-in and fan-out capabilities can be employed in fabricating the novel logic arrangements and systems of the invention. Also, it should be noted that the input weights chosen in each application need not be exact integral values so long as the desired switching operation is maintained.

Furthermore, it should be understood that the preferred embodiment of the various aspects of this invention have been described and illustrated herein in order to explain the nature of the invention, and that various changes, modifications, and equivalent circuit and logic arrangements may be employed without departing from the spirit and scope of the invention as expressed in the appended claims.

I claim:

1. A logical circuit arrangement for generating a binary coded output signal having a plurality of bits each with a predetermined numerical significance to represent the value of applied input signals, comprising:

a plurality of threshold gate elements each having an input summation network for summing each of a plurality of applied signals with a given weight, output means for generating a positive binary output signal indicative of the binary value of one of the bits of said binary coded output signal and for generating a negative output signal having the opposite binary value, and means for establishing a threshold level corresponding to the numerical significance of the bit being generated by said threshold gate element, said output means generating a positive binary output signal with a first binary value only when the signals applied to the input summation network produce a sum exceeding said threshold level;

means connecting each input signal to each of said plurality of threshold gate elements with a weight proportional to the numerical significance of the maximum numerical value of the input signal;

means connecting the negative output signal from each of said threshold gate elements generating bits having greater numerical significance to the input summation network of each threshold gate element generating a bit of lesser numerical significance with a weight equal to the greater numerical significance to be subtracted from the weight of the signals being summed in each input summation network when the positive binary output signal with the greater significance has said first binary value, each of said plurality of threshold gate elements including a majority gate element in which the means for establishing a threshold level includes means for generating a comparison signal indicative of whether the total summation of all signals having said first binary value is at least equal to the total weight of all signals having the other binary value applied to the input summation network, and means for applying an offset signal with a fixed binary value at a predetermined weight to said input summation network, and said output means is responsive to said comparison signal for generating a positive output signal having said first binary value whenever the total weight of all inputs having said binary value exceeds the total weight of all inputs having the other binary value, said predetermined weight being selected for each majority gate element so that when the numerical significance of the sum of the applied input signals exceeds the numerical significance of the bit generated by each of said majority gate elements said first binary value is generated as said positive binary output signal.

2. The logical circuit arrangement of claim 1, wherein:

the applied input signals are three separate binary input signals each having a binary one value corresponding to said first binary value and a binary zero value corresponding to the other binary value;

said plurality of threshold gate elements consisting of first and second majority gate elements interconnected with the positive output signal from said first majority gate element constituting a carry signal with a numerical significance of 2 and with the positive output signal from said second majority gate element constituting a binary bit output with a numerical significance of 1;

each of said binary valued input signals being connected by said input signal connecting means to the input summation network of said first majority gate element with a first unit weight and to the input summation network of the second majority gate element with a second unit weight;

said means for establishing said threshold level for said first majority gate element consisting of means connecting a fixed binary zero valued signal to the input summation network of said first majority gate element with a weight equal to said first unit weight;

said negative output signal connecting means connecting the negative output signal of said first majority gate element to the input summation network of the second majority gate element with a weight twice the second unit weight.

3. The logical circuit arrangement of claim 1 wherein:

said applied input signals are a plurality of binary coded signals each having a given number of separate binary bits each having a progressively larger numerical significance;

each of said plurality of threshold gate elements generating one of the bits of a binary coded output signal having a maximum value equal to the maximum sum of said binary coded input signals, each of said output signal bits having a progressively greater numerical significance;

said input signal connecting means connecting each of the bits of said plurality of binary coded input signals to the input summation network of each of said threshold gate elements with a weight equal to the numerical significance of the input bits, said threshold level for each threshold gate element corresponding to the numerical significance of the bit being generated thereby.

4. The logical circuit arrangement off claim 3 wherein said plurality of binary coded signals are a plurality of binary coded decimal digits having unit significance, each comprising:

four separate binary bits each having a progressively larger numerical significance, the number of said plurality of threshold gate elements being equal to 4 plus an additional number, each of said threshold gate elements generating one of the bits of a binary coded decimal output signal having a maximum value equal the the maximum sum of said binary coded input signals, four of said threshold gate elements generating four binary output bits representative of a decimal number having unit significance, and each of the additional number of threshold gate elements generating a binary output bit representative of a number with tens significance;

said threshold level for each of said threshold gate elements corresponding to the numerical significance of the binary output bit being generated thereby.

5. The logic arrangement of claim 4 wherein:

each of said threshold gate elements is a majority gate element, with said means for establishing said threshold level for each said majority gate element consisting of means connecting a first fixed binary valued signal with a first given weight to the input summation network of said majority gate element generating the binary output bits with unit significance and for connecting a second fixed binary valued signal with a second given weight to each of the additional majority gate elements generating a binary output bit with tens significance.

6. The logical circuit arrangement of claim 1 wherein:

the applied input signals consist of a variable analog voltage;

each of said plurality of threshold gate elements generating one of the bits of the binary coded output signal, said binary coded output signal having a numerical significance indicative of the analog level of said voltage;

said input-signal-connecting means connecting said analog voltage to the input summation network of each threshold gate element with a weight corresponding to a desired numerical significance when the value of said analog voltage is at a level equal to the voltage level of said first binary value.

7. The logical circuit arrangement of claim 6 wherein:

the bits of said binary coded output signal are representative of binary coded decimal numbers having units and tens decimal significance, four of said plurality of said threshold gate elements generating the bits of the decimal number having unit significance and additional ones of said plurality of threshold gate elements generating the bits of the number having tens significance.

8. The logical circuit arrangement of claim 7 wherein:

each of said plurality of threshold gate elements is a majority gate element, and said means for establishing a threshold level for each majority gate element consists of means for applying a first fixed binary valued signal with a first given weight to the input summation network of the four majority gate elements generating the binary output bits with units significance and for connecting a second fixed binary valued signal with a second given weight to each of the additional majority gate elements generating a binary output bit with tens significance.

9. An analog-to-digital converter system for generating a binary coded number having a value representative of the amplitude of an input voltage, comprising:

a plurality of threshold gating elements, each having means for summing applied input signals with a given weight and for generating an output having opposite binary values, each said output constituting one binary bit of said binary coded number and having a first binary value whenever the sum of the applied input signals to a particular one of said threshold gating elements exceeds the numerical value of the binary bit in said binary coded number generated by said particular threshold-gating element;

means connecting the output signal from each threshold gating element generating a more significant bit of said binary coded number as an input signal to each of the plurality of threshold gating elements generating less significant bits of said binary coded number with a weight proportional to the numerical value of the more significant bit to reduce the sum of the applied input signals; and means connecting said input voltage to be applied as an input signal with a selected weight to each of said plurality of threshold gating elements, each of said plurality of threshold gate elements including a majority gate element in which the means for establishing a threshold level includes means for generating a comparison signal indicative of whether the total summation of all signals having said first binary value is at least equal to the total weight of all signals having the other binary value applied to the input summation network, and means for applying an offset signal with a fixed binary value at a predetermined weight to said input summation network, and said output means is responsive to said comparison signal for generating a positive output signal having said first binary value whenever the total weight of all inputs having said binary value exceeds the total weight of all inputs having the other binary value, said predetermined weight being selected for each majority gate element so that when the numerical significance of the sum of the applied input signals exceeds the numerical significance of the bit generated by each of said majority gate elements said first binary value is generated as said positive binary output signal.

10. The system of claim 9 wherein:

said binary coded number is a binary coded decimal number having a plurality of decimal digits;

the output signal from each of said plurality of threshold gating elements representing a different bit of one of said binary coded decimal digits.

* * * * *